(12) United States Patent
Takizawa

(10) Patent No.: US 8,670,054 B2
(45) Date of Patent: Mar. 11, 2014

(54) SOLID-STATE IMAGE PICKUP DEVICE WITH ISOLATED ORGANIC PHOTOELECTRIC CONVERSION FILM PORTIONS, METHOD FOR MANUFACTURING THE SAME, AND IMAGE PICKUP APPARATUS

(75) Inventor: Ritsuo Takizawa, Tokyo (JP)

(73) Assignee: Sony Corporation (JP)

( * ) Notice: Subject to any disclaimer, the term of this patent is extended or adjusted under 35 U.S.C. 154(b) by 272 days.

(21) Appl. No.: 12/849,083

(22) Filed: Aug. 3, 2010

(65) Prior Publication Data

US 2011/0032376 A1   Feb. 10, 2011

(30) Foreign Application Priority Data

Aug. 10, 2009   (JP) .................................. 2009-185533

(51) Int. Cl.
*H04N 5/335* (2011.01)
(52) U.S. Cl.
USPC ........................................ 348/294; 348/222.1
(58) Field of Classification Search
USPC ............................................... 348/222.1, 294
See application file for complete search history.

(56) References Cited

U.S. PATENT DOCUMENTS

| | | | |
|---|---|---|---|
| 6,177,343 B1 * | 1/2001 | Watanabe et al. | 438/639 |
| 8,237,834 B2 * | 8/2012 | Inuiya | 348/294 |
| 2001/0027009 A1 * | 10/2001 | Matsubara et al. | 438/618 |
| 2003/0160235 A1 * | 8/2003 | Hirai | 257/40 |
| 2006/0158547 A1 * | 7/2006 | Komatsu et al. | 348/340 |
| 2007/0238034 A1 * | 10/2007 | Holscher | 430/7 |
| 2008/0246853 A1 * | 10/2008 | Takizawa et al. | 348/222.1 |
| 2009/0050881 A1 * | 2/2009 | Hayashi | 257/40 |
| 2009/0308458 A1 * | 12/2009 | Aramaki et al. | 136/263 |
| 2010/0060769 A1 * | 3/2010 | Inuiya | 348/311 |
| 2010/0110271 A1 * | 5/2010 | Yanagita et al. | 348/340 |
| 2011/0074994 A1 * | 3/2011 | Wakabayashi et al. | 348/302 |

FOREIGN PATENT DOCUMENTS

| | | |
|---|---|---|
| JP | 2001-313338 | 11/2001 |
| JP | 2003-007993 | 1/2003 |
| JP | 2003-234460 | 8/2003 |
| JP | 2003-332310 | 11/2003 |
| JP | 2005-286154 | 10/2005 |
| JP | 2005-303266 | 10/2005 |
| JP | 2008-053252 | 3/2008 |
| JP | 2008-258474 | 10/2008 |
| JP | 2008-288253 | 11/2008 |

OTHER PUBLICATIONS

Official Action (no English translation available) for Japanese Patent Application No. 2009-185533 mailed Oct. 22, 2013, 4 pages.

* cited by examiner

*Primary Examiner* — Timothy J Henn
*Assistant Examiner* — Abdelaaziz Tissire
(74) *Attorney, Agent, or Firm* — Sheridan Ross P.C.

(57) ABSTRACT

A solid-state image pickup device is provided which includes a plurality of pixels provided in a semiconductor substrate, the pixels including a plurality of photoelectric conversion portions and MOS transistors which selectively read out signals therefrom, at least one organic photoelectric conversion film on the photoelectric conversion portions, and an isolation region provided in the organic photoelectric conversion film at a position corresponding to between the pixels to perform optical and electrical isolation.

15 Claims, 10 Drawing Sheets

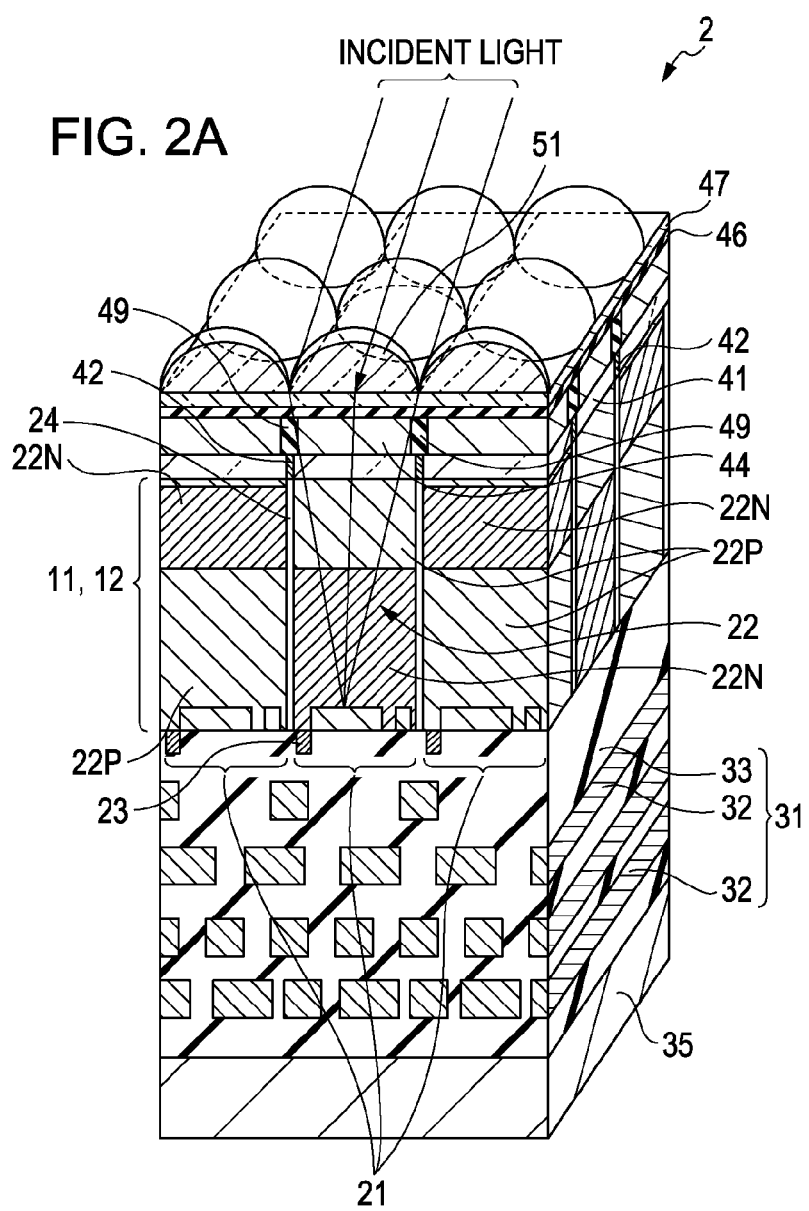
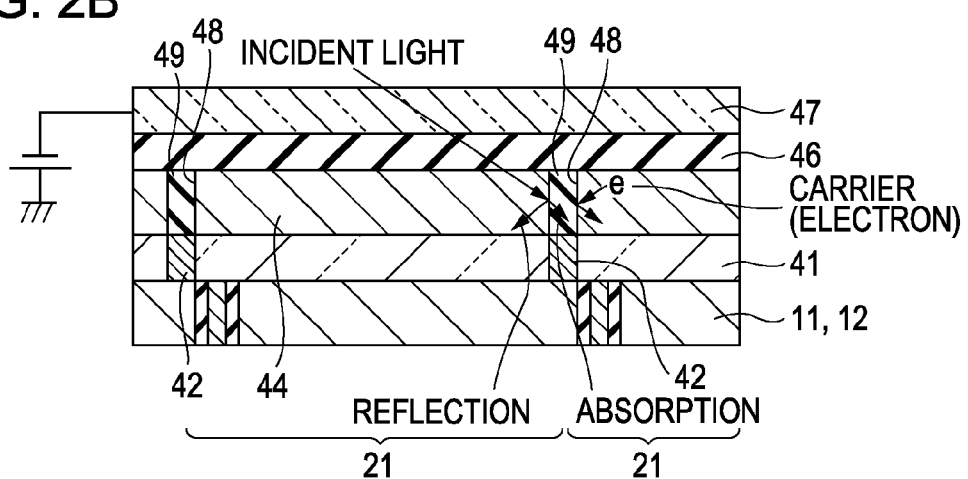

SOLID-STATE IMAGE PICKUP DEVICE WITH ISOLATED ORGANIC PHOTOELECTRIC CONVERSION FILM PORTIONS, METHOD FOR MANUFACTURING THE SAME, AND IMAGE PICKUP APPARATUS

BACKGROUND OF THE INVENTION

1. Field of the Invention

The present invention relates to a solid-state image pickup device, a method for manufacturing the same, and an image pickup apparatus.

2. Description of the Related Art

A semiconductor image sensor has a plurality of pixels functioning as photoelectric conversion portions. As this semiconductor image sensor, for example, there may be mentioned a CMOS sensor in which MOS transistors are used as elements which selectively read out a plurality of pixels and a charge coupled device (CCD) in which charges are transferred in a silicon substrate and are then read out, and these two image sensors are each a semiconductor device which reads out signals of pixels. In recent years, because of features of the CMOS sensor, such as low voltage, low power consumption, and multifunctionality, much attention has been paid thereto as an image pickup element, such as a mobile phone camera, a digital still camera, and a digital video camera, and hence the range of the use of the CMOS sensor has been increased.

In addition, as a color image sensor, a technique has been generally used in which a color filter having, for example, three types of colors RGB (RGB Bayer arrangement is commonly used) is formed in each pixel, and spatial color separation is performed. According to this technique, when spectral characteristics of a color filter are appropriately adjusted, superior color reproduction can be achieved. However, since light absorption by the color filter itself is not small, there has been a fundamental problem in that light incident on the image sensor may not be sufficiently effectively utilized.

In addition, since spatial color separation is performed, pixels of the image sensor may not be effectively used. For example, when the number of green pixels is small, the resolution of luminance signals is degraded, and when the number of red and/or blue pixels is small, the resolution of color signals is degraded, that is, false color signals are disadvantageously generated.

Furthermore, concomitant with a reduction in size of the image sensor and an increase in number of pixels thereof, recently, the cell size of one pixel has been reduced to 2.0 μm square or less. Accordingly, the area and the volume per one pixel are naturally reduced, and as a result, the amount of saturation signals and the sensitivity are decreased, so that the image quality is degraded. Hence, when R/G/G signals can be obtained by one pixel or two to three pixels without reducing the cell size, while the sensitivity and the amount of saturation signals are each maintained at a predetermined level, the spatial luminance and the chroma resolution can be maintained.

As a method for solving the above problem, in recent years, an image sensor using a multilayer organic photoelectric conversion film has been developed (for example, see Japanese Unexamined Patent Application Publication No. 2003-234460). As shown in FIG. 9, an organic photoelectric conversion film 126 having a sensitivity to blue (B), an organic photoelectric conversion film 128 having a sensitivity to green (G), and an organic photoelectric conversion film 130 having a sensitivity to red (R) are sequentially laminated to each other. According to the image sensor described above, by the above structure, B/G/R signals can be separately obtained from one pixel, and the sensitivity can be improved.

On the other hand, a device has been realized in which only one organic photoelectric conversion film is formed to extract one color signal therefrom, and two color signals are extracted by silicon (Si) bulk spectroscopy (for example, see Japanese Unexamined Patent Application Publication No. 2005-303266). In addition, the inventors of the present invention have proposed, by using the structure of a whole-area-open-type CMOS image sensor (or also referred to as "back-illuminated CMOS image sensor"), a structure capable of improving the sensitivity and color reproduction (for example, see Japanese Unexamined Patent Application Publication No. 2008-258474).

The structure of one of these related techniques is shown in FIGS. 10A to 11B by way of example.

As shown in FIGS. 10A and 10B, for example, although lower electrodes 141 are independently formed for respective pixels 121, an organic photoelectric conversion layer 144, a blocking film 146 for decreasing a dark current, and the like are not separated for the respective pixels 121.

Hence, optical factors and electrical factors between the pixels 121 degrade spatial resolution capability and are partially responsible for color mixture. As the optical factors, for example, a phenomenon in which light incident on one pixel directly leaks in an adjacent pixel thereto may be mentioned, and as the electrical factors, for example, a phenomenon in which carriers generated by photoelectric conversion of light incident on one pixel leak in an adjacent pixel thereto may be mentioned.

When the organic photoelectric conversion film 144 has a small thickness, since a voltage is applied between transparent electrodes, influences of the above-described optical factors and electrical factors are relatively small. However, in order to improve the spectral characteristics, hereinafter, the thickness of the organic photoelectric conversion film 144 tends to be increased. In this case, it becomes more difficult to ignore problems, such as occurrence of color mixture and degradation in spatial resolution capability, and hence improvements thereof have been strongly desired.

As one example of a method to suppress the color mixture and the degradation in spatial resolution capability, as shown in FIG. 11A, the structure has been disclosed in which a first electrode 162, a buffer layer 163, a photoelectric conversion layer 164, and a second electrode 165 are provided on a substrate 161 and are isolated for each element (for example, see Japanese Unexamined Patent Application Publication No. 2008-53252). In addition, as shown in FIG. 11B, the structure has been disclosed in which a first electrode 162, a buffer layer 163, and a photoelectric conversion layer 164 are provided on a substrate 161 and are isolated for each pixel and in which an electrical insulating portion 169 is formed at an isolation portion (for example, see Japanese Unexamined Patent Application Publication No. 2008-53252). As a method for isolating the photoelectrical conversion layer 164 and the buffer layer 163 for each element, etching or lift-off has been used. However, in the etching, degradation in characteristics caused by damage and control of selection ratio are problems, and in the lift-off, for example, pattern accuracy, fine pattern handling, and dust generation are problems. Furthermore, although electrical isolation has been proposed, optical isolation to directly avoid the color mixture has not been disclosed, and the effect of preventing the color mixture has not been sufficient.

SUMMARY OF THE INVENTION

The problem to be solved is that although the electrical isolation is performed, the optical isolation to avoid the color mixture is not sufficient.

A solid-state image pickup device using an organic photoelectric conversion film according to an embodiment of the present invention is able to suppress the occurrence of color mixture and the degradation in spatial resolution capability, which are caused by electrical and optical factors.

A solid-state image pickup device according to an embodiment of the present invention includes a plurality of pixels provided in a semiconductor substrate, the pixels including a plurality of photoelectric conversion portions and MOS transistors which selectively read out signals therefrom, at least one organic photoelectric conversion film on the photoelectric conversion portions, and an isolation region provided in the organic photoelectric conversion film at a position corresponding to between the pixels to perform optical and electrical isolation.

In the solid-state image pickup device according to an embodiment of the present invention, since the isolation region which performs optical and electrical isolation is formed in the organic photoelectric conversion film at the position corresponding to between the pixels, light incident on one pixel is prevented from directly leaking in an adjacent pixel thereto. In addition, carriers generated by photoelectrical conversion of light incident on one pixel are prevented from leaking in an adjacent pixel thereto.

A method for manufacturing a solid-state image pickup device according to an embodiment of the present invention includes the steps of forming a plurality of pixels in a semiconductor substrate, the pixels including a plurality of photoelectric conversion portions and MOS transistors selectively reading out signals therefrom, forming at least one organic photoelectric conversion film on the photoelectric conversion portions, and forming an isolation region performing optical and electrical isolation in the organic photoelectric conversion film at a position corresponding to between the pixels.

According to the method for manufacturing a solid-state image pickup device according to an embodiment of the present invention, since the isolation region which performs optical and electrical isolation is formed in the organic photoelectric conversion film at the position corresponding to between the pixels, light incident on one pixel is prevented from directly leaking in an adjacent pixel thereto. In addition, carriers generated by photoelectrical conversion of light incident on one pixel are prevented from leaking in an adjacent pixel thereto.

An image pickup apparatus according to an embodiment of the present invention includes a light condensing optical portion condensing incident light, an image pickup portion having a solid-state image pickup device which receives light condensed by the light condensing optical portion and performs photoelectrical conversion of the light, and a signal processing portion processing a signal which is photoelectrical-converted by the solid-state image pickup device and is output from the image pickup portion, and the solid-state image pickup device includes a plurality of pixels provided in a semiconductor substrate, the pixels including a plurality of photoelectric conversion portions and MOS transistors selectively reading out signals therefrom, at least one organic photoelectric conversion film on the photoelectric conversion portions, and an isolation region provided in the organic photoelectric conversion film at a position corresponding to between the pixels to perform optical and electrical isolation.

In the image pickup apparatus according to an embodiment of the present invention, since the solid-state image pickup device according to an embodiment of the present invention is used, a solid-state image pickup device in which the spatial resolution capability is enhanced and the color mixture is suppressed is used.

In the solid-state image pickup device according to an embodiment of the present invention, since light incident on one pixel is prevented from directly leaking in an adjacent pixel thereto, and carriers generated by photoelectrical conversion of light incident on one pixel is prevented from leaking in an adjacent pixel thereto, the spatial resolution capability can be enhanced, and the color mixture can be suppressed. As a result, a high-quality image can be obtained with high accuracy.

In the method for manufacturing a solid-state image pickup device according to an embodiment of the present invention, since light incident on one pixel is prevented from directly leaking in an adjacent pixel thereto, and carriers generated by photoelectrical conversion of light incident on one pixel is prevented from leaking in an adjacent pixel thereto, the spatial resolution capability can be enhanced, and the color mixture can be suppressed. As a result, a solid-state image pickup device capable of forming a high-quality image with high accuracy can be manufactured.

In the image pickup apparatus according to an embodiment of the present invention, since the spatial resolution capability can be enhanced, and the color mixture can be suppressed, a high-quality image can be advantageously recorded.

BRIEF DESCRIPTION OF THE DRAWINGS

FIG. 2A is a schematic structural perspective cross-sectional view showing a second example of the solid-state image pickup;

FIG. 2B is a partial cross-sectional view of the solid-state image pickup device shown in FIG. 2A;

DESCRIPTION OF THE PREFERRED EMBODIMENTS

Hereinafter, modes (hereinafter referred to as "embodiments") for carrying out the present invention will be described.

<1. First Embodiment>

[First Example of Structure of Solid-State Image Pickup Device]

Figure 1A:
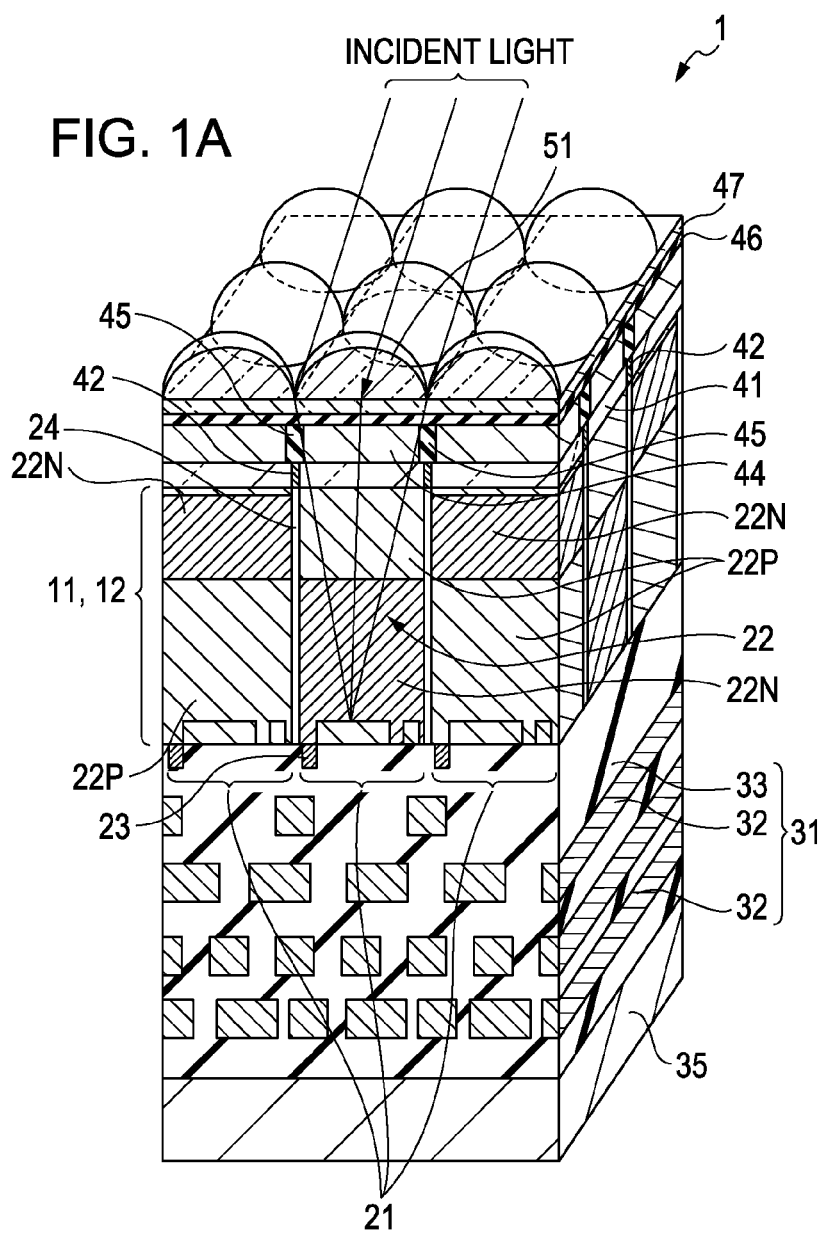
FIG. 1A is a schematic structural perspective cross-sectional view showing a first example of a solid-state image pickup device according to a first embodiment of the present invention.
Figure 1B:
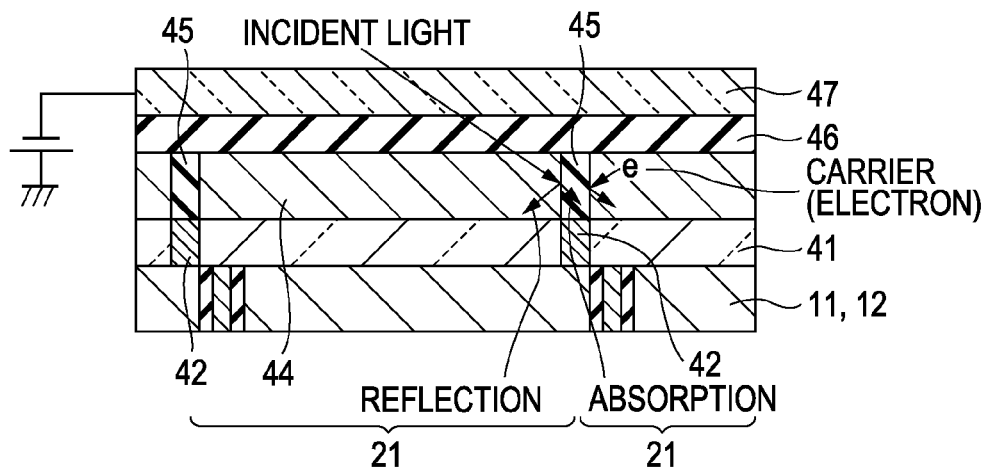
FIG. 1B is a partial cross-sectional view of the solid-state image pickup device shown in FIG. 1A.

A first example of the structure of a solid-state image pickup device 1 according to a first embodiment of the present invention will be described using a schematic structural perspective cross-sectional view and a partial cross-sectional view shown in FIGS. 1A and 1B, respectively. In FIGS. 1A and 1B, as one example using the solid-state image pickup device 1 according to the first embodiment of the present invention, a whole-area-open-type CMOS image sensor is shown.

As shown in FIGS. 1A and 1B, a plurality of pixels 21 which includes photoelectric conversion portions (such as photodiodes) 22 converting incident light to electrical signals, transistor groups 23 (some of them are shown in the figure) composed of MOS transistors, and the like is formed in an active layer 12 formed of a semiconductor substrate 11. The transistor groups 23 each include, for example, a transfer transistor, an amplifier transistor, and a reset transistor. For the semiconductor substrate 11, for example, a silicon substrate is used. Furthermore, a signal processing portion (not shown) processing a signal charge read out from each of the photoelectric conversion portions 22 is also formed.

Along a part of the periphery of each pixel 21, for example, in a row or a line direction between adjacent pixels 21, an element isolation region 24 is formed.

In addition, a wire layer 31 is formed at a front surface side (a lower side of the semiconductor substrate 11 in the figure) of the semiconductor substrate 11 in which the photoelectric conversion portions 22 are formed. This wire layer 31 includes wires 32 and an insulating film 33 covering the wires 32. A support substrate 35 is formed on the wire layer 31. This support substrate 35 is formed, for example, of a silicon substrate.

Furthermore, in the solid-state image pickup device 1, an insulating film (not shown) having an optical transparency is formed at a rear surface side of the semiconductor substrate 11. In addition, on this insulating film (an upper surface side in the figure), first electrodes 41 are formed.

For the first electrode 41, a transparent electrode material is used. For example, there may be used indium oxide-based ITO (Sn is added as a dopant to $In_2O_3$), $SnO_2$ (added with a dopant) as a tin oxide-based material, an aluminum zinc oxide (Al is added as a dopant to ZnO, such as AZO) as a zinc oxide-based material, a gallium zinc oxide (Ga is added as a dopant to ZnO, such as GZO), an indium zinc oxide (In is added as a dopant to ZnO, such as IZO), $CuI$, $InSbO_4$, $ZnMgO$, $CuInO_2$, $MgIn_2O_4$, $CdO$, and $ZnSnO_3$.

In addition, an electrode isolation region 42 is formed between the first electrodes 41 so as to correspond to between the pixels 21. That is, the first electrodes 41 are independently formed to correspond to the respective pixels. In addition, the surface of each of the first electrodes 41 and the surface of the electrode isolation region 42 are preferably planarized to be flush with each other.

Furthermore, an organic photoelectric conversion film 44 is formed on the first electrodes 41 and the electrode isolation region 42.

In addition, depending on the difference in ionization potential between the first electrode 41 and the organic photoelectric conversion film 44, a blocking film (not shown) similar to a blocking film 46 which will be described later may be necessary between the first electrodes 41 and the organic photoelectric conversion film 44 in some cases.

The organic photoelectric conversion film 44 is formed, for example, to have a thickness of 100 nm. This thickness may be optionally selected. As this organic photoelectric conversion film 44, for example, polymers of phenylene vinylene, fluorene, carbazole, indole, pyrene, pyrrole, pycoline, thiophene, acetylene and diacetylene or derivatives thereof may be used.

Furthermore, for example, there can be preferably used metal complex dyes, cyanine-based dyes, merocyanine-based dyes, phenylxanthene-based dyes, triphenylmethane-based dyes, rhodacyanine-based dyes, xanthene-based dyes, macrocyclic aza-annulene-based dyes, azulene-based dyes, naphtoquinone-based dyes, anthraquinone-based dyes, chain compounds obtained by condensation between condensed polycyclic aromatic compounds, such as anthracene and pyrene, and aromatic or hetero ring compounds, two nitrogen-containing heterocyclic rings, such as quinoline, benzothiazole, and benzooxazole, bonded through a squarylium group and/or a croconic methine group, and cyanine analogue dyes bonded by a squarylium group and/or a croconic methine group.

In addition, as the metal complex dyes, dithiol metal complex dyes, metal phthalocyanine dyes, metal porphyrin dyes or ruthenium complex dyes are preferable, and the ruthenium complex dyes are particularly preferable; however, the metal complex dyes are not limited to those mentioned above.

Furthermore, an isolation region 45 is formed in the organic photoelectric conversion film 44 at a position corresponding to between the pixels 21. Hence, the isolation region 45 is formed along upper side peripheries of the pixels 21. That is, the organic photoelectric conversion film 44 is divided by the isolation region 45 so as to correspond to the pixels. This isolation region 45 is formed of an impurity region which has insulating properties and which reflects or absorbs incident light. For example, the isolation region 45 is formed by implanting an impurity, such as nitrogen (N) or oxygen (O), in the organic photoelectric conversion film 44, for example, at a dose of $1 \times 10^{11}$ cm$^{-2}$ or more.

As an impurity which forms an isolation region 45 optically absorbing light, for example, carbon (C), oxygen (O), and nitrogen (N) may be mentioned, and when at least one of these impurities is implanted, an absorption layer in which bond absorption of an organic compound occurs can be formed.

As an impurity which forms an isolation region 45 optically reflecting light, for example, hydrogen (H), helium (He), oxygen (O), and nitrogen (N) may be mentioned, and when at least one of these impurities is implanted, an isolation region 45 having a low refractive index compared to that of the organic photoelectric conversion film 44 is formed. Hence, optical reflection occurs at an interface between the organic photoelectric conversion film 44 and the isolation region 45. In addition, in order to form the interface at which optical reflection occurs, the impurity concentration distribution is preferably made as steep as possible. In addition, as the impurity which forms an isolation region 45 optically reflecting light, a metal ion element, such as titanium (Ti), zirconium (Zr), hafnium (Hf), or tungsten (W), having a high reflectance may also be mentioned.

Next, among impurities which impart electrical insulating properties, there is an impurity which is turned into an electrically insulating material when being implanted in the organic photoelectric conversion film 44, and for example, oxygen (O) and nitrogen (N) may be mentioned.

Among the impurities mentioned above, an impurity which forms a region performing optical isolation (absorption or reflection) in the organic photoelectric conversion film 44 and an impurity which forms a region having electrical insulating properties therein can be selected, and as an impurity which can achieve the above-described optical and electrical isolation, for example, oxygen (O) and nitrogen (N) may be mentioned.

In addition, when an impurity which forms an isolation region imparting optical absorption or reflection properties and an impurity which forms an isolation region imparting electrical insulating properties are both implanted in the organic photoelectric conversion film 44, an isolation region 45 performing optical and electrical isolation may also be formed.

Alternatively, in a region of the organic photoelectric conversion film 44 in which bonds of an organic photoelectric conversion material are broken, the isolation region 45 is formed. For example, when helium (He), argon (Ar), nitrogen (N), oxygen (O), or the like is ion-implanted in the organic photoelectric conversion film 44 at a high dose, damage is done to bonds between molecules and/or atoms (for example, the bonds are broken thereby), and as a result, the isolation region 45 is formed.

In addition, in the isolation region 45 formed by ion-implantation of an impurity in the organic photoelectric conversion film 44, some impurity thus implanted shows the above optical and/or insulating properties, and some impurity forms a compound in the organic photoelectric conversion film 44 and shows the above properties.

In addition, although the isolation region 45 is formed to coincide with the electrode isolation region 42, as for the relative relationship between the width of the isolation region 45 and the width of the electrode isolation region 42, the widths thereof may not be necessarily equal to each other, and the position of the isolation region 45 may not necessarily coincide with that of the electrode isolation region 42.

Hence, hereinafter, the effect of the difference in size between the electrode isolation region 42 and the isolation region 45 will be described.

For example, when the sensitivity is necessary for the organic photoelectric conversion film 44 in a fine cell (when the area of the organic photoelectric conversion film 44 is increased), the width of the isolation region 45 may be set smaller than the width of the electrode isolation region 42.

In order to avoid the color mixture between pixels and/or to sufficiently increase the resolution, the width of the isolation region 45 may be set larger than the width of the electrode isolation region 42.

Furthermore, for example, when it is desired to perform pupil correction, while the width of the isolation region 45 and that of the electrode isolation region 42 are set to equal to each other or are set to have a predetermined ratio, the center positions of the respective widths may be shifted in a direction from a central pixel to a peripheral pixel located in a chip. Furthermore, in some cases, both the widths and positions of the isolation region 45 and the electrode isolation region 42 may be gradually changed and shifted, respectively.

For example, when the isolation region 45 is formed by an ion implantation method, in order not to do damage to the first electrode 41 and/or in order not to mix a secondary sputtered material from the first electrode 41 into the organic photoelectric conversion film 44, the width and the position of the isolation region 45 may be made to coincide with those of the electrode isolation region 42. In addition, the position of the isolation region 45 may be made to coincide with the position of the electrode isolation region 42, and the width of the isolation region 45 may be formed smaller than the width of the electrode isolation region 42.

A second electrode 47 is formed on the organic photoelectric conversion film 44 with the insulating blocking film 46 interposed therebetween.

For the blocking film 46, for example, any material may be used as long as it is transparent in a desired wavelength region of the organic photoelectric conversion film 44 and has ionization potential (IP) different from that of the second electrode 47 and the organic photoelectric conversion film 44. For example, for an organic photoelectric conversion film composed of quinacridone, aluminum quinoline (Alq3) or the like may be effectively used. This blocking film 46 is relatively selected in consideration of the work function of the organic photoelectric conversion film 44 and that of the second electrode 47 and is not simply determined by one primary characteristic. For example, an organic SOG or a low dielectric constant film of a polyaryl ether, a polyimide, a fluorinated silicon oxide, a silicon carbide, or the like may be used to form the blocking film 46. In addition, a transparent electrode material forming the second electrode 47 or an organic photoelectric conversion material forming the organic photoelectric conversion film 44 may also be used when conditions are satisfied.

For the second electrode 47, a transparent electrode material is used. For example, there may be used indium oxide-based ITO (Sn is added as a dopant to $In_2O_3$), $SnO_2$ (added with a dopant) as a tin oxide-based material, an aluminum zinc oxide (Al is added as a dopant to ZnO, such as AZO) as a zinc oxide-based material, a gallium zinc oxide (Ga is added as a dopant to ZnO, such as GZO), an indium zinc oxide (In is added as a dopant to ZnO, such as IZO), CuI, $InSbO_4$, ZnMgO, $CuInO_2$, $MgIn_2O_4$, CdO, and $ZnSnO_3$.

A condenser lens (on-chip lens) 51 condensing incident light on each of the photoelectric conversion portions 22 is formed on the second electrode 47.

When the condenser lenses 51 are formed, for example, an antireflection layer (not shown) may be formed on the surfaces of the condenser lenses 51. In addition, an antireflection layer (not shown) may be formed between the condenser lenses 51 and the organic photoelectric conversion film 44.

As described above, the solid-state image pickup device 1 is formed.

It is assumed that in the solid-state image pickup device 1, for example, a signal corresponding to green is extracted from the organic photoelectric conversion film 44, and signals corresponding to blue and red are extracted by bulk spectroscopy. In this case, one example of a planar arrangement (cording) of the organic photoelectric conversion film 44 and the photoelectric conversion portions 22 using the bulk spectroscopy will be described.

As a green dye of the organic photoelectric conversion film 44, for example, a rhodamine dye, a phthalocyanine derivative, quinacridone, eosin-Y, and a merocyanine dye may be mentioned.

The green of the organic photoelectric conversion film 44 is disposed in every pixel. In addition, the respective photoelectric conversion portions 22 in which blue and red signals are extracted by the bulk spectroscopy are disposed, for example, in a checkered pattern. Extraction of blue and red signals by the spectroscopy is achieved by the following principle.

In order to extract blue and red signals by the bulk spectroscopy, the depth of an N⁻ region 22N and that of a P⁺ region 22P, which form a photodiode provided in each photoelectric conversion portion 22, are made different from each other. That is, as for blue, the N⁻ region 22N is formed in a region close to a light incident side (the depth of light penetration is small), so that blue light is preferentially photoelectric-converted. In addition, since the P⁺ region 22P is formed in a deep region, photoelectric conversion of red light is suppressed. On the other hand, as for red, the N⁻ region 22N is formed in a region far from the light incident side (the depth of light penetration is large), so that red light is preferentially photoelectric-converted. In addition, in a region close to the light incident side, the deep P⁺ region 22P is formed, so that photoelectric conversion of blue light is suppressed. In each pixel, in accordance with the wavelength, the depth of the N⁻ region 22N and the depth of the P⁺ region 22P are preferably optimized.

Alternatively, the green of the organic photoelectric conversion film 44 is disposed in every pixel. In addition, the photoelectric conversion portions 22 in which blue and red signals are extracted by the bulk spectroscopy are formed in one pixel. The extraction of blue and red signals by the spectroscopy is achieved by the following principle.

In order to extract blue and red signals by the bulk spectroscopy, although not shown in the figure, the photoelectric conversion portion 22 is formed to have a multilayer structure including a first N⁻ region, a P⁺ region, and a second N⁻ region in that order from the light incident side. That is, blue light is received by a PN junction between the first N⁻ region and the P⁺ region, which is formed in a region close to the light incident side (the depth of light penetration is small), and is preferentially photoelectric-converted. On the other hand, red light is received by a PN junction between the P⁺ region and the second N⁻ region, which is formed in a region far from the light incident side (depth of light penetration is large), and is preferentially photoelectric-converted. The depths of the first N⁻ region, the P⁺ region, and the second N⁻ region are each preferably optimized in accordance with received wavelengths.

By the structure described above, the solid-state image pickup device 1 can output separated color signals of green, blue, and red. In addition, since the organic photoelectric conversion film 44 is formed from only one layer, lead electrodes (metal films are commonly used) (not shown) and the organic photoelectric conversion film 44 can be advantageously easily machined. In addition, since the bulk spectroscopy is used, damage is no longer done to the organic photoelectric conversion film 44. When there is a fear that adhesion between the materials may occur, an isolation layer (not shown) is preferably provided between the layers.

In the solid-state image pickup device 1, the case in which a green signal is extracted from the organic photoelectric conversion film 44, and blue and red signals are extracted by the bulk spectroscopy is shown by way of example; however, another combination may also be used. Furthermore, besides the three primary colors, combination among intermediate colors or arrangement of four colors or more may also be used. In addition, although the case in which the solid-state image pickup device 1 is applied to a whole-area-open-type CMOS image sensor is shown by way of example, of course, it may also be applied to a common CMOS image sensor. In addition, the spectroscopy in the photoelectric conversion portion 22 may also be performed using an organic color filter layer (not shown). In this case, the organic color filter layer may be provided under the organic photoelectric conversion film 44 with an optical transparent insulating film interposed therebetween or may be provided on the organic photoelectric conversion film 44 with an insulating film interposed therebetween.

In addition, in the solid-state image pickup device 1, in order to reduce a dark current and white output pixel defects, a film lowering an interface state and a film having a negative fixed charge (not shown) may be sequentially formed on the surface of the photoelectric conversion portion 22 so as to form a hole accumulation layer at a light receiving surface side of the photoelectric conversion portion 22.

The film lowering an interface state is formed, for example, of a silicon oxide ($SiO_2$) film.

In addition, since the film having a negative fixed charge is formed on the film lowering an interface state, the hole accumulation layer (not shown) is formed at the light receiving surface side of the photoelectric conversion portion 22.

Hence, the film lowering an interface level is formed at least on the photoelectric conversion portion 22 to have a thickness so that the hole accumulation layer can be formed at the light receiving surface side of the photoelectric conversion portion 22 by the film having a negative fixed charge. The thickness is set, for example, to 1 atomic layer to 100 nm.

The film having a negative fixed charge is formed, for example, from a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. Since the films mentioned above have been actually used, for example, as a gate insulating film of an insulating gate type field effect transistor, film forming methods for the above films are already established, and hence the above films can be easily formed.

As the film forming methods, for example, a chemical vapor deposition method, a sputtering method, and an atomic layer deposition method may be mentioned; however, an atomic layer deposition method is preferably used since a $SiO_2$ layer lowering an interface state can be simultaneously formed to have a thickness of approximately 1 nm during the film formation.

In addition, besides the materials mentioned above, lanthanum oxide ($La_2O_3$), praseodymium oxide ($Pr_2O_3$), celium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$) may also be mentioned.

Furthermore, the film having a negative fixed charge may also be formed from a hafnium nitride film, an aluminum nitride film, a hafnium oxynitride film, or an aluminum oxynitride film.

The film having a negative fixed charge may contain silicon (Si) and/or nitrogen (N) as long as the insulating properties are not degraded. The concentration thereof is appropriately determined in the range in which the insulating properties of the film are not degraded. However, in order not to generate image defects, such as white spots, additives such as the silicon and/or nitrogen are preferably added to the surface of the film having a negative fixed charge, that is, to a surface opposite to the active layer 12 side.

As described above, by addition of silicon (Si) and/or nitrogen (N), heat resistance of the film and capability of preventing ion implantation in the process can be improved.

In addition, as a method for forming the films described above, for example, a sputtering method, an atomic layer deposition (ALD) method, a chemical vapor deposition (CVD) method, or a molecular beam epitaxy (MBE) method may be used.

In the solid-state image pickup device 1, since the isolation region 45 performing optical and electrical isolation is formed in the organic photoelectric conversion film 44 at the position corresponding to between the pixels 21, light incident on one pixel is prevented from directly leaking in an adjacent pixel thereto. In addition, carriers (such as electrons e) generated by photoelectrical conversion of light incident on one pixel is prevented from leaking in an adjacent pixel thereto. That is, the isolation region 45 has an optical isolation (absorption or reflection) function as well as electrical insulating properties.

Since the electrode isolation region 42 and the isolation region 45 are formed to be connected to each other, leakage between the electrode isolation region 42 and the isolation region 45 is prevented, and hence the effect described above can be further enhanced.

Accordingly, spatial resolution capability can be enhanced, and color mixture can be suppressed, so that a high quality image can be obtained with high accuracy.

In addition, since being formed from an impurity region, the isolation region 45 can be formed, for example, by local ion implantation, and hence, unlike a related technique, etching damage to the organic photoelectric conversion film 44 is not generated. In addition, the degree of machining difficulty for forming the isolation region 45 can be reduced.

[Second Example of Structure of Solid-State Image Pickup Device]

A second example of the structure of a solid-state image pickup device will be described using a schematic structural perspective cross-sectional view and a partial cross-sectional view shown in FIGS. 2A and 2B, respectively. In FIGS. 2A and 2B, as one example using the solid-state image pickup device according to an embodiment of the present invention, a whole-area-open-type CMOS image sensor is shown.

As shown in FIGS. 2A and 2B, in a solid-state image pickup device 2, an isolation region 49 corresponding to the isolation region 45 of the solid-state image pickup device 1 is formed so as to fill an isolation groove 48 formed in an organic photoelectric conversion film 44.

That is, a plurality of pixels 21 which includes photoelectric conversion portions (such as photodiodes) 22 converting incident light to electrical signals, transistor groups 23 (some of them are shown in the figure) composed of MOS transistors, and the like is formed in an active layer 12 formed of a semiconductor substrate 11. The transistor groups 23 each include, for example, a transfer transistor, an amplifier transistor, and a reset transistor. For the semiconductor substrate 11, for example, a silicon substrate is used. Furthermore, a signal processing portion (not shown) processing a signal charge read out from each of the photoelectric conversion portions 22 is also formed.

Along a part of the periphery of each pixel 21, for example, in a row or a line direction between adjacent pixels 21, an element isolation region 24 is formed.

In addition, a wire layer 31 is formed at a front surface side (a lower side of the semiconductor substrate 11 in the figure) of the semiconductor substrate 11 in which the photoelectric conversion portions 22 are formed. This wire layer 31 includes wires 32 and an insulating film 33 covering the wires 32. A support substrate 35 is formed on the wire layer 31. This support substrate 35 is formed, for example, of a silicon substrate.

Furthermore, in the solid-state image pickup device 2, an insulating film (not shown) having an optical transparency is formed at a rear surface side of the semiconductor substrate 11. In addition, on this insulating film (an upper surface side in the figure), first electrodes 41 are formed.

For the first electrode 41, a transparent electrode material is used. For example, there may be used indium oxide-based ITO (Sn is added as a dopant to $In_2O_3$), $SnO_2$ (added with a dopant) as a tin oxide-based material, an aluminum zinc oxide (Al is added as a dopant to ZnO, such as AZO) as a zinc oxide-based material, a gallium zinc oxide (Ga is added as a dopant to ZnO, such as GZO), an indium zinc oxide (In is added as a dopant to ZnO, such as IZO), CuI, $InSbO_4$, ZnMgO, $CuInO_2$, $MgIn_2O_4$, CdO, and $ZnSnO_3$.

In addition, an electrode isolation region 42 is formed between the first electrodes 41 so as to correspond to between the pixels 21. That is, the first electrodes 41 are independently formed to correspond to the respective pixels. In addition, the surface of each of the first electrodes 41 and the surface of the electrode isolation region 42 are preferably planarized to be flush with each other.

Furthermore, the organic photoelectric conversion film 44 is formed on the first electrodes 41 and the electrode isolation region 42.

In addition, depending on the difference in ionization potential between the first electrode 41 and the organic photoelectric conversion film 44, a blocking film (not shown) similar to a blocking film 46 which will be described later may be necessary between the first electrodes 41 and the organic photoelectric conversion film 44 in some cases.

The organic photoelectric conversion film 44 is formed, for example, to have a thickness of 100 nm. This thickness may be optionally selected. As this organic photoelectric conversion film 44, for example, polymers of phenylene vinylene, fluorene, carbazole, indole, pyrene, pyrrole, pycoline, thiophene, acetylene and diacetylene or derivatives thereof may be used.

Furthermore, for example, there can be preferably used metal complex dyes, cyanine-based dyes, merocyanine-based dyes, phenylxanthene-based dyes, triphenylmethane-based dyes, rhodacyanine-based dyes, xanthene-based dyes, macrocyclic aza-annulene-based dyes, azulene-based dyes, naphtoquinone-based dyes, anthraquinone-based dyes, chain compounds obtained by condensation between condensed polycyclic aromatic compounds, such as anthracene and pyrene, and aromatic or hetero ring compounds, two nitrogen-containing heterocyclic rings, such as quinoline, benzothiazole, and benzooxazole, bonded through a squarylium group and/or a croconic methine group, and cyanine analogue dyes bonded by a squarylium group and/or a croconic methine group.

In addition, as the metal complex dyes, dithiol metal complex dyes, metal phthalocyanine dyes, metal porphyrin dyes or ruthenium complex dyes are preferable, and the ruthenium complex dyes are particularly preferable; however, the metal complex dyes are not limited to those mentioned above.

Furthermore, the isolation groove 48 is formed in the organic photoelectric conversion film 44 at a position corresponding to between the pixels 21, and the isolation region 49 is formed so as to fill this isolation groove 48. Hence, the isolation region 49 is formed along upper side peripheries of the pixels 21. This isolation region 49 is a region which has insulating properties and which reflects or absorbs incident light. Hence, the above organic photoelectric conversion film 44 is divided to correspond to the respective pixels.

In this solid-state image pickup device, as one example, the insulating blocking film 46 formed on the organic photoelectric conversion film 44 is buried. That is, the blocking film 46 is formed on the organic photoelectric conversion film 44 and is partially formed in the isolation groove 48, and as a result, the isolation region 49 is formed from the blocking film 46 buried in the groove 48.

Furthermore, a second electrode 47 is formed on the blocking film 46.

For the blocking film 46, for example, any material may be used as long as it is transparent in a desired wavelength region of the organic photoelectric conversion film 44 and has ionization potential (IP) different from that of the second electrode 47 and the organic photoelectric conversion film 44. For example, for an organic photoelectric conversion film composed of quinacridone, aluminum quinoline (Alq3) or the like is effectively used. This blocking film 46 is relatively selected in consideration of the work function of the organic photoelectric conversion film 44 and that of the second electrode 47 and is not simply determined by one primary characteristic. For example, an organic SOG or a low dielectric constant film of a polyaryl ether, a polyimide, a fluorinated silicon oxide, a silicon carbide, or the like may be used to form the blocking film 46. In addition, a transparent electrode material forming the second electrode 47 or an organic photoelectric conversion material forming the organic photoelectric conversion film 44 may also be used when conditions are satisfied.

For the second electrode 47, a transparent electrode material is used. For example, there may be used indium oxide-based ITO (Sn is added as a dopant to $In_2O_3$), $SnO_2$ (added with a dopant) as a tin oxide-based material, an aluminum zinc oxide (Al is added as a dopant to ZnO, such as AZO) as a zinc oxide-based material, a gallium zinc oxide (Ga is added as a dopant to ZnO, such as GZO), an indium zinc oxide (In is added as a dopant to ZnO, such as IZO), CuI, $InSbO_4$, ZnMgO, $CuInO_2$, $MgIn_2O_4$, CdO, and $ZnSnO_3$.

A condenser lens (on-chip lens) 51 condensing incident light on each of the photoelectric conversion portions 22 is formed on the second electrode 47.

When the condenser lenses 51 are formed, for example, an antireflection layer (not shown) may be formed on the surfaces of the condenser lenses 51. In addition, an antireflection layer (not shown) may be formed between the condenser lenses 51 and the organic photoelectric conversion film 44.

As described above, the solid-state image pickup device 2 is formed.

The organic photoelectric conversion film 44 may be formed of a photosensitive material, such as a photosensitive organic photoelectric conversion material. The photosensitivity thereof may be either a positive type or a negative type.

As the photosensitive organic photoelectric conversion material, a photosensitive material may be mixed with the aforementioned organic photoelectric conversion material, or a photosensitive functional group may be imparted to an organic photoelectric conversion material itself. As the photosensitive material or the photosensitive functional group, for example, an azido compound-based, a diazonaphtoquinone novolac-based, a chemical amplification-based, and an optical amplification-based material or group, each of which is generally known in a lithographic technique field, may be mentioned and may be selected in consideration of matching with an organic photoelectric conversion material.

As described above, since the organic photoelectric conversion film 44 has photosensitivity, after the organic photoelectric conversion film 44 is formed, when exposure and development processes are performed thereon, the isolation groove 48 can be formed. Since the above isolation groove 48 is formed by the exposure and development processes as described above, unlike a related technique, etching damage is not done to the organic photoelectric conversion film 44.

Whenever necessary, before and/or after the exposure and/or the development process, an appropriate baking treatment is performed.

In addition, as a material forming the isolation region 49, any material may be used as long as it has an electrical isolation function (insulating properties) and an optical isolation (absorption or reflection) function.

For example, a material different from that forming the blocking film 46 may be used for forming the isolation region 49.

For example, the isolation region 49 may be formed using a carbon black resist having photosensitivity. An isolation region 49 formed from a carbon black resist has insulating properties and also has an optical isolation function caused by optical absorption of contained carbon.

In addition, although the isolation region 49 is formed to coincide with the electrode isolation region 42, as for the relative relationship between the width of the isolation region 49 and the width of the electrode isolation region 42, the widths thereof may not be necessarily equal to each other, and the position of the isolation region 49 may not necessarily coincide with that of the electrode isolation region 42. The effect of the difference in size between the electrode isolation region 42 and the isolation region 49 is the same as described above.

In addition, the isolation region 49 may also be formed in the blocking film 46 formed on the organic photoelectric conversion film 44 at a position corresponding to between the pixels.

In the solid-state image pickup device 2, the case in which a green signal is extracted from the organic photoelectric conversion film 44, and blue and red signals are extracted by the bulk spectroscopy is shown by way of example; however, another combination may also be used. Furthermore, besides the three primary colors, combination among intermediate colors or arrangement of four colors or more may also be used. In addition, although the case in which the solid-state image pickup device 2 is applied to a whole-area-open-type CMOS image sensor is shown by way of example, of course, it may also be applied to a common CMOS image sensor. In addition, the spectroscopy in the photoelectric conversion portion 22 may also be performed using an organic color filter layer (not shown). In this case, the organic color filter layer may be provided under the organic photoelectric conversion film 44 with an optical transparent insulating film interposed therebetween or may be provided on the organic photoelectric conversion film 44 with an insulating film interposed therebetween.

In addition, in the solid-state image pickup device 2, as in the case of the solid-state image pickup device 1, a film lowering an interface state and a film having a negative fixed charge (not shown) may be sequentially formed on the surface of the photoelectric conversion portion 22 so as to form a hole accumulation layer at a light receiving surface side of the photoelectric conversion portion 22. As described above, when the hole accumulation layer is formed at the light receiving surface side of the photoelectric conversion portion 22, a dark current and/or white output pixel defects can be reduced.

In the solid-state image pickup device 2, since the isolation region 49 performing optical and electrical isolation is formed in the organic photoelectric conversion film 44 at the position corresponding to between the pixels 21, light incident on one pixel is prevented from directly leaking in an adjacent pixel thereto. In addition, carriers (such as electrons e) generated by photoelectrical conversion of light incident on one pixel is prevented from leaking in an adjacent pixel thereto. That is, the isolation region 49 has an optical isolation (absorption or reflection) function as well as electrical insulating properties.

Since the electrode isolation region 42 and the isolation region 49 are formed to be connected to each other, leakage between the electrode isolation region 42 and the isolation region 49 is prevented, and hence the effect described above can be further enhanced.

Accordingly, the spatial resolution capability can be enhanced, and the color mixture can be suppressed, so that a high quality image can be obtained with high accuracy.

In addition, since the isolation groove 48 can be formed using exposure and development processes, unlike a related technique, etching damage to the organic photoelectric conversion film 44 is not generated. In addition, the degree of machining difficulty for forming the isolation region 49 can be reduced.

[Third and Fourth Examples of Structure of Solid-State Image Pickup Device]

A third and a fourth example of the structure of a solid-state image pickup device will be described using schematic structural cross-sectional views in FIGS. 3A and 3B, respectively, each of which shows an important portion.

Figure 3A:
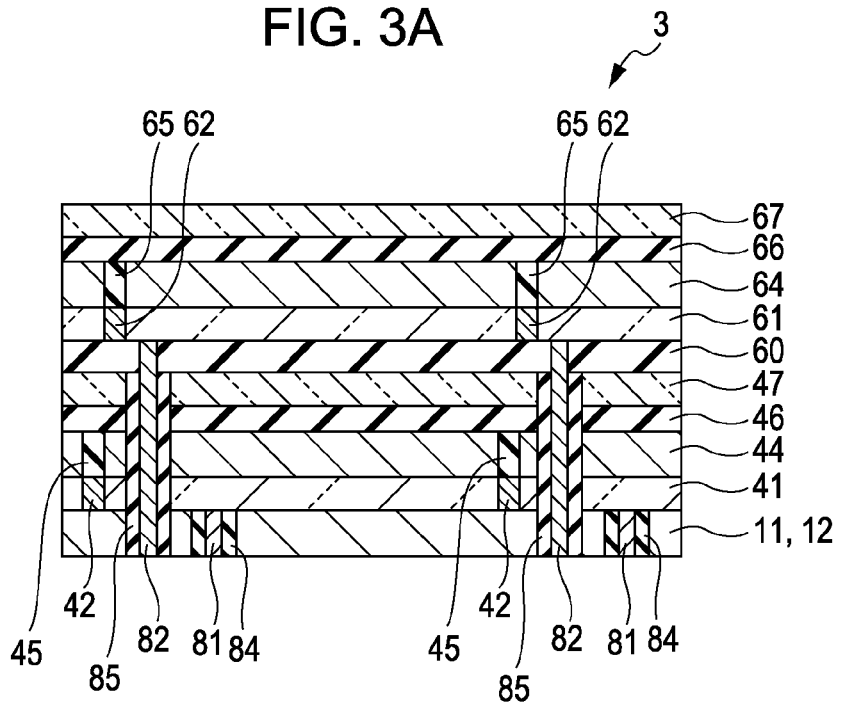
FIGS. 3A and 3B are each a schematic structural cross-sectional view showing a modified example of the solid-state image pickup device.
Figure 3B:
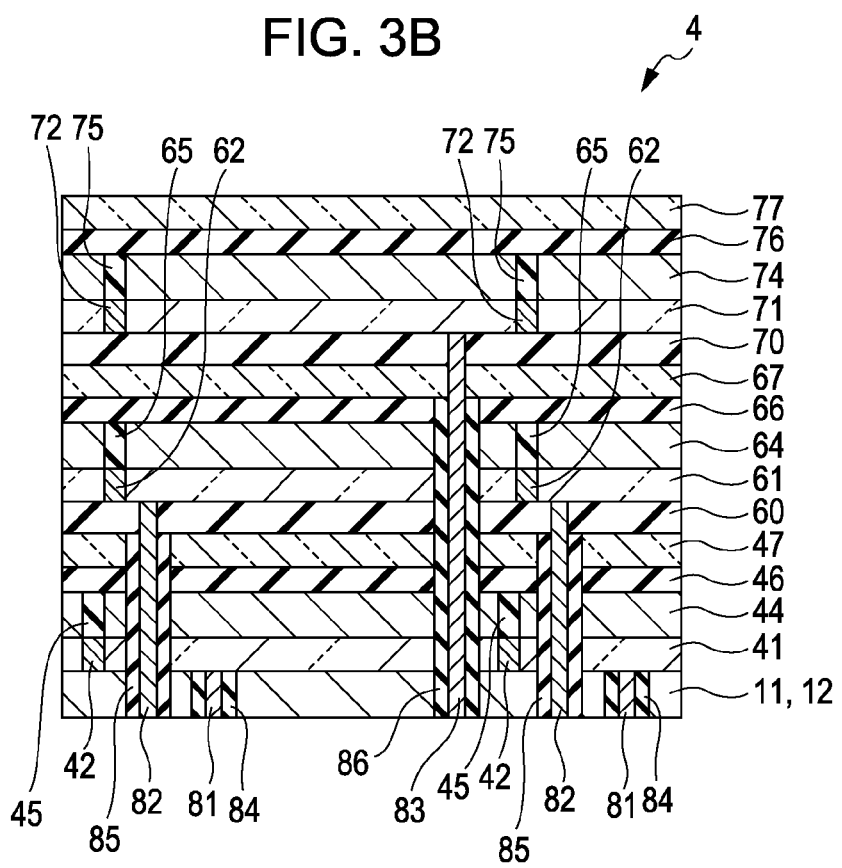

In FIGS. 3A and 3B, as one example using the solid-state image pickup device according to an embodiment of the present invention, a whole-area-open-type CMOS image sensor is shown.

[Third Example of Structure of Solid-State Image Pickup Device]

As shown in FIG. 3A, as in the case of the solid-state image pickup device 1, in a solid-state image pickup device 3, first electrodes 41, an organic photoelectric conversion film 44, a blocking film 46, and a second electrode 47, which are a first layer group, are formed on an active layer 12 of a semiconductor substrate 11. An electrode isolation region 42 separating the first electrodes 41 for respective pixels is formed between the first electrodes 41, and an isolation region 45 dividing the organic photoelectric conversion film 44 for each pixel is formed therein.

In addition, first electrodes 61, an organic photoelectric conversion film 64, a blocking film 66, and a second electrode 67, which are a second layer group, are formed on the second electrode 47 with an insulating film 60 interposed therebetween. An electrode isolation region 62 separating the first electrodes 61 for the respective pixels is formed between the first electrodes 61, and an isolation region 65 dividing the organic photoelectric conversion film 64 for each pixel is formed therein.

In this solid-state image pickup device 3, contact portions 81 and 82 with insulating films 84 and 85 provided therearound, respectively, are formed from the active layer 12 side so as to be connected to the first electrodes 41 and 61, respectively.

In addition, depending on the difference in ionization potential between the first electrode layer 41 and the organic photoelectric conversion film 44, a blocking film (not shown) similar to the blocking film 46 described above may be necessary in some cases between the first electrodes 41 and the organic photoelectric conversion film 44. As in the case described above, depending on the difference in ionization potential between the first electrode layer 61 and the organic photoelectric conversion film 64, a blocking film (not shown) similar to the blocking film 66 described above may be necessary in some cases between the first electrodes 61 and the organic photoelectric conversion film 64.

[Fourth Example of Structure of Solid-State Image Pickup Device]

As shown in FIG. 3B, as in the case of the solid-state image pickup device 3, in a solid-state image pickup device 4, first electrodes 41, an organic photoelectric conversion film 44, a blocking film 46, and a second electrode 47, which are a first layer group, are formed on an active layer 12 of a semiconductor substrate 11. An electrode isolation region 42 separating the first electrodes 41 for respective pixels is formed between the first electrodes 41, and an isolation region 45 dividing the organic photoelectric conversion film 44 for each pixel is formed therein.

In addition, first electrodes 61, an organic photoelectric conversion film 64, a blocking film 66, and a second electrode 67, which are a second layer group, are formed on the second electrode 47 with an insulating film 60 interposed therebetween. An electrode isolation region 62 separating the first electrodes 61 for the respective pixels is formed between the first electrodes 61, and an isolation region 65 dividing the organic photoelectric conversion film 64 for each pixel is formed therein.

Furthermore, first electrodes 71, an organic photoelectric conversion film 74, a blocking film 76, and a second electrode 77, which are a third layer group, are formed on the second electrode 67 with an insulating film 70 interposed therebetween. An electrode isolation region 72 separating the first electrodes 71 for the respective pixels is formed between the first electrodes 71, and an isolation region 75 dividing the organic photoelectric conversion film 74 for each pixel is formed therein.

In this solid-state image pickup device 4, contact portions 81, 82, and 83 with insulating films 84, 85, and 86 provided therearound, respectively, are formed from the active layer 12 side so as to be connected to the first electrodes 41, 61, and 71, respectively.

In addition, depending on the difference in ionization potential between the first electrode 41 and the organic photoelectric conversion film 44, a blocking film (not shown) similar to the blocking film 46 described above may be necessary in some cases between the first electrodes 41 and the organic photoelectric conversion film 44. As in the case described above, depending on the difference in ionization potential between the first electrode layer 61 and the organic photoelectric conversion film 64, a blocking film (not shown) similar to the blocking film 66 described above may be necessary in some cases between the first electrodes 61 and the organic photoelectric conversion film 64. Furthermore, as in the case described above, depending on the difference in ionization potential between the first electrode layer 71 and the organic photoelectric conversion film 74, a blocking film (not shown) similar to the blocking film 76 described above may be necessary in some cases between the first electrodes 71 and the organic photoelectric conversion film 74.

[Fifth and Sixth Examples of Structure of Solid-State Image Pickup Device]

Next, a fifth and a sixth example of the structure of a solid-state image pickup device will be described using schematic structural cross-sectional views in FIGS. 4A and 4B, respectively, each of which shows an important portion.

Figure 4A:
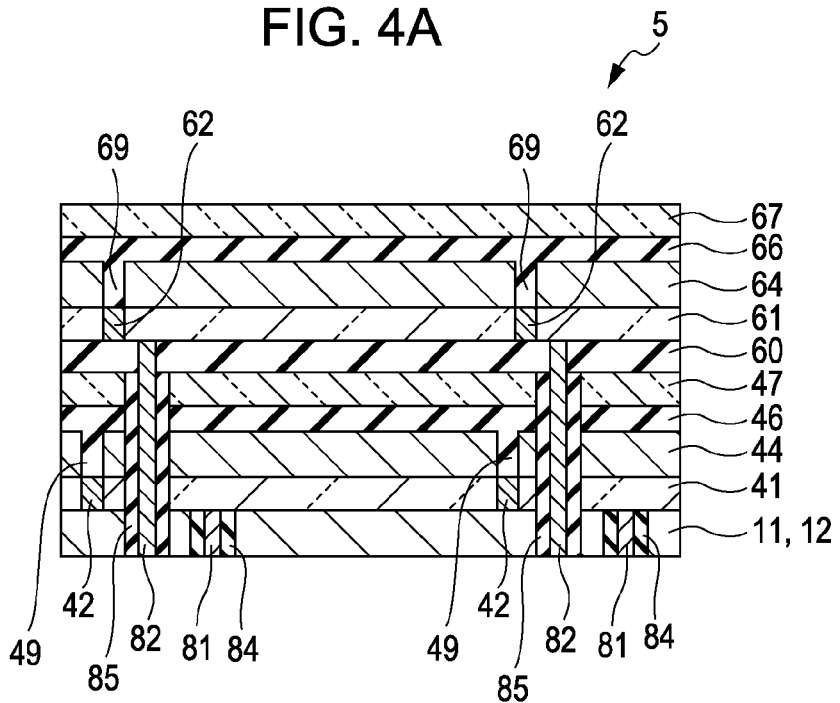
FIGS. 4A and 4B are each a schematic structural cross-sectional view showing a modified example of the solid-state image pickup.
Figure 4B:
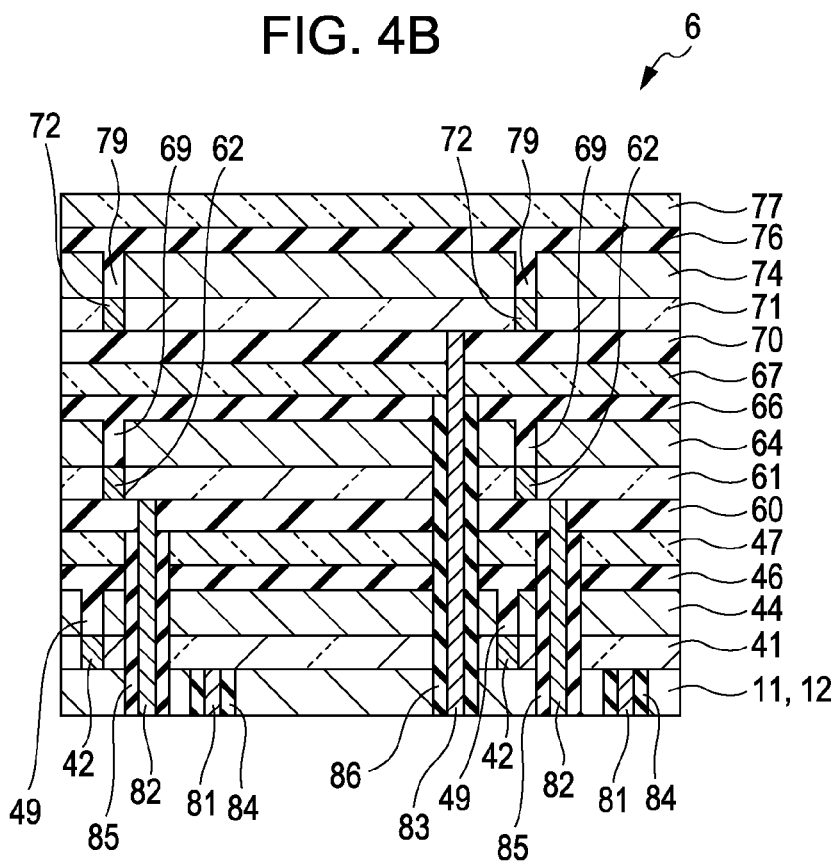

In FIGS. 4A and 4B, as one example using the solid-state image pickup device according to an embodiment of the present invention, a whole-area-open-type CMOS image sensor is shown.

[Fifth Example of Structure of Solid-State Image Pickup Device]

As shown in FIG. 4A, as in the case of the solid-state image pickup device 2, in a solid-state image pickup device 5, first electrodes 41, an organic photoelectric conversion film 44, a blocking film 46, and a second electrode 47, which are a first layer group, are formed on an active layer 12 of a semiconductor substrate 11. An electrode isolation region 42 separating the first electrodes 41 for respective pixels is formed between the first electrodes 41, and an isolation region 49 dividing the organic photoelectric conversion film 44 for each pixel is formed therein.

In addition, first electrodes 61, an organic photoelectric conversion film 64, a blocking film 66, and a second electrode 67, which are a second layer group, are formed on the second electrode 47 with an insulating film 60 interposed therebetween. An electrode isolation region 62 separating the first electrodes 61 for the respective pixels is formed between the first electrodes 41, and an isolation region 69 dividing the organic photoelectric conversion film 64 for each pixel is formed therein.

In this solid-state image pickup device 5, contact portions 81 and 82 with insulating films 84 and 85 provided therearound, respectively, are formed from the active layer 12 side so as to be connected to the first electrodes 41 and 61, respectively.

In addition, depending on the difference in ionization potential between the first electrode layer 41 and the organic photoelectric conversion film 44, a blocking film (not shown) similar to the blocking film 46 described above may be necessary in some cases between the first electrodes 41 and the organic photoelectric conversion film 44. As in the case described above, depending on the difference in ionization potential between the first electrode layer 61 and the organic photoelectric conversion film 64, a blocking film (not shown) similar to the blocking film 66 described above may be necessary in some cases between the first electrodes 61 and the organic photoelectric conversion film 64.

[Sixth Example of Structure of Solid-State Image Pickup Device]

As shown in FIG. 4B, as in the case of the solid-state image pickup device 5, in a solid-state image pickup device 6, first electrodes 41, an organic photoelectric conversion film 44, a blocking film 46, and a second electrode 47, which are a first layer group, are formed on an active layer 12 of a semiconductor substrate 11. An electrode isolation region 42 separating the first electrodes 41 for respective pixels is formed between the first electrodes 41, and an isolation region 49 dividing the organic photoelectric conversion film 44 for each pixel is formed therein.

In addition, first electrodes 61, an organic photoelectric conversion film 64, a blocking film 66, and a second electrode 67, which are a second layer group, are formed on the second electrode 47 with an insulating film 60 interposed therebetween. An electrode isolation region 62 separating the first electrodes 61 for the respective pixels is formed between the first electrodes 61, and an isolation region 69 dividing the organic photoelectric conversion film 64 for each pixel is formed therein.

Furthermore, first electrodes 71, an organic photoelectric conversion film 74, a blocking film 76, and a second electrode 77, which are a third layer group, are formed on the second electrode 67 with an insulating film 70 interposed therebetween. An electrode isolation region 72 separating the first electrodes 71 for the respective pixels is formed between the first electrodes 71, and an isolation region 79 dividing the organic photoelectric conversion film 74 for each pixel is formed therein.

In this solid-state image pickup device 6, contact portions 81, 82, and 83 with insulating films 84, 85, and 86 provided therearound, respectively, are formed from the active layer 12 side so as to be connected to the first electrodes 41, 61, and 71, respectively.

In addition, depending on the difference in ionization potential between the first electrode 41 and the organic photoelectric conversion film 44, a blocking film (not shown) similar to the blocking film 46 described above may be necessary in some cases between the first electrodes 41 and the organic photoelectric conversion film 44. As in the case described above, depending on the difference in ionization potential between the first electrode layer 61 and the organic photoelectric conversion film 64, a blocking film (not shown) similar to the blocking film 66 described above may be necessary in some cases between the first electrodes 61 and the organic photoelectric conversion film 64. Furthermore, as in the case described above, depending on the difference in ionization potential between the first electrode layer 71 and the organic photoelectric conversion film 74, a blocking film (not shown) similar to the blocking film 76 described above may be necessary in some cases between the first electrodes 71 and the organic photoelectric conversion film 74.

As described above, at least two organic photoelectric conversion films may be provided. In this case, the number of colors extracted by the bulk spectroscopy of the photoelectric conversion portion 22 may be either one or two. For example, it may be even possible that two colors are extracted by the bulk spectroscopy and three colors are extracted using the organic photoelectric conversion films.

<2. Second Embodiment>

[First Example of Method for Manufacturing Solid-State Image Pickup Device]

Next, a first example of a method for manufacturing a solid-state image pickup device according to a second embodiment of the present invention will be described with reference to manufacturing process cross-sectional views shown in FIGS. 5A to 6B. This manufacturing method is one example of a method for manufacturing the above-described solid-state image pickup device 1. In addition, constituent elements are designated by the same reference numerals as those of the solid-state image pickup device 1 described with reference to FIGS. 1A and 1B.

First, although not shown in the figure, by a common manufacturing method, a plurality of pixels 21 having, for example, photoelectric conversion portions (such as photodiodes) 22 converting incident light into electrical signals and transistor groups 23 (some of them are shown in the figure) each including a transfer transistor, an amplifier transistor, a reset transistor, and the like is formed in an active layer 12 (see FIG. 5A) formed of a semiconductor substrate 11. For the semiconductor substrate 11, for example, a silicon substrate is used. Furthermore, a signal processing portion (not shown) processing a signal charge read out from each of the photoelectric conversion portions 22 is also formed.

Along a part of the periphery of each pixel 21, for example, in a row or a line direction between adjacent pixels 21, an element isolation region 24 is formed.

In addition, a wire layer 31 is formed at a front surface side (a lower side of the semiconductor substrate 11 in the figure) of the semiconductor substrate 11 in which the photoelectric conversion portions 22 are formed. This wire layer 31 includes wires 32 and an insulating film 33 covering the wires 32. A support substrate 35 is formed on the wire layer 31. This support substrate 35 is formed, for example, of a silicon substrate.

Furthermore, an insulating film (not shown) having an optical transparency is formed at a rear surface side of the semiconductor substrate 11. In addition, on this insulating film (an upper surface side in the figure), first electrodes 41 are formed.

For the first electrode 41, a transparent electrode material is used. For example, there may be used indium oxide-based ITO (Sn is added as a dopant to $In_2O_3$), $SnO_2$ (added with a dopant) as a tin oxide-based material, an aluminum zinc oxide (Al is added as a dopant to ZnO, such as AZO) as a zinc oxide-based material, a gallium zinc oxide (Ga is added as a dopant to ZnO, such as GZO), an indium zinc oxide (In is added as a dopant to ZnO, such as IZO), CuI, $InSbO_4$, ZnMgO, $CuInO_2$, $MgIn_2O_4$, CdO, and $ZnSnO_3$.

Figure 5A:
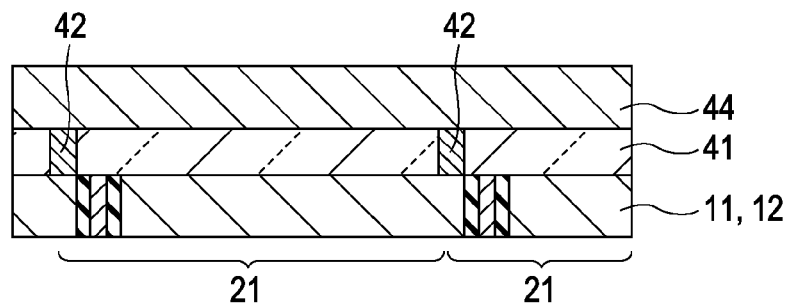
FIGS. 5A to 5C are manufacturing process cross-sectional views showing a first example of a method for manufacturing a solid-state image pickup device according to a second embodiment of the present invention.

In addition, as shown in FIG. 5A, an electrode isolation region 42 is formed between the first electrodes 41 so as to correspond to between the pixels 21. That is, the first electrodes 41 are separated to correspond to the respective pixels. The electrode isolation region 42 is formed in such a way that after an insulating film is formed to bury the first electrodes 41, the surface of the insulating film is planarized to expose the surfaces of the first electrodes 41. For this insulating film, an insulating film used for a common semiconductor device is used. For example, a silicon oxide film is used.

Next, an organic photoelectric conversion film 44 is formed on the first electrodes 41 and the electrode isolation region 42. The organic photoelectric conversion film 44 is formed, for example, to have a thickness of 100 nm. This thickness may be optionally selected. As this organic photoelectric conversion film 44, for example, polymers of phenylene vinylene, fluorene, carbazole, indole, pyrene, pyrrole, pycoline, thiophene, acetylene and diacetylene or derivatives thereof may be used.

Furthermore, for example, there can be preferably used metal complex dyes, cyanine-based dyes, merocyanine-based dyes, phenylxanthene-based dyes, triphenylmethane-based dyes, rhodacyanine-based dyes, xanthene-based dyes, macrocyclic aza-annulene-based dyes, azulene-based dyes, naphtoquinone-based dyes, anthraquinone-based dyes, chain compounds obtained by condensation between condensed polycyclic aromatic compounds, such as anthracene and pyrene, and aromatic or hetero ring compounds, two nitrogen-containing heterocyclic rings, such as quinoline, benzothiazole, and benzooxazole, bonded through a squarylium group and/or a croconic methine group, and cyanine analogue dyes bonded by a squarylium group and/or a croconic methine group.

In addition, as the metal complex dyes, dithiol metal complex dyes, metal phthalocyanine dyes, metal porphyrin dyes or ruthenium complex dyes are preferable, and the ruthenium complex dyes are particularly preferable; however, the metal complex dyes are not limited to those mentioned above.

Figure 5B:
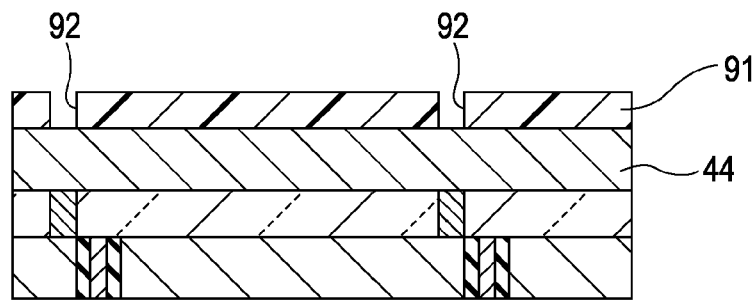

Next, as shown in FIG. 5B, after a resist film 91 is formed on the organic photoelectric conversion film 44, an opening portion 92 is formed in the resist film 91 by a lithography technique, such as exposure and development. This opening portion 92 is formed in the organic photoelectric conversion film 44 to correspond to between the pixels.

As a photoresist used for the resist film 91, a material used for a common semiconductor process may be used, and a resist strippable from an organic photoelectric conversion material may be used. As the above resist, for example, an azido compound resist, a diazonaphthoquinone-novolac resist, a chemical amplification resist, and an optical amplification resist may be mentioned.

Figure 5C:
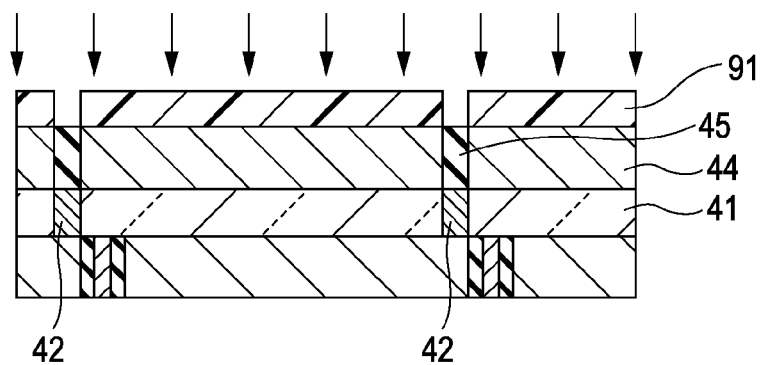

Next, as shown in FIG. 5C, by an ion implantation method using the resist film 91 as an ion implantation mask, an impurity is implanted in the organic photoelectric conversion film 44 at a position corresponding to between the pixels 21 to form an isolation region 45. Hence, the isolation region 45 is formed along upper peripheral portions of the pixels. That is, the organic photoelectric conversion film 44 is divided for each pixel by the isolation region 45. As the impurity, there is selected an impurity forming an impurity region used as an isolation region 45 which has insulating properties and which reflects or absorbs incident light. For example, an impurity, such as nitrogen (N) or oxygen (O), is implanted in the organic photoelectric conversion film 44, for example, at a dose of $1\times10^{11}$ $cm^{-2}$ or more.

As an impurity forming an isolation region 45 which optically absorbs light, for example, carbon (C), oxygen (O), and nitrogen (N) may be mentioned, and when at least one of these impurities is implanted, an absorption layer in which bond absorption of an organic compound occurs can be formed.

As an impurity forming an isolation region 45 which optically reflects light, for example, hydrogen (H), helium (He), oxygen (O), and nitrogen (N) may be mentioned, and when at least one of these impurities is implanted, an isolation region 45 having a low refractive index compared to that of the organic photoelectric conversion film 44 is formed. Hence, optical reflection occurs at an interface between the organic photoelectric conversion film 44 and the isolation region 45. In addition, in order to form an interface at which optical reflection occurs, the impurity concentration distribution is preferably made as steep as possible. In addition, as the impurity forming an isolation region 45 which optically reflects light, a metal ion element, such as titanium (Ti), zirconium (Zr), hafnium (Hf), or tungsten (W), having a high reflectance may also be mentioned.

Next, among impurities which impart electrical insulating properties, there is an impurity which is turned into an electrically insulating material when being implanted in the organic photoelectric conversion film 44, and for example, oxygen (O) and nitrogen (N) may be mentioned.

Among the impurities mentioned above, an impurity which forms a region capable of performing optical isolation (absorption or reflection) in the organic photoelectric conversion film 44 and an impurity which forms a region having electrical insulating properties therein may be selected. As an impurity which can achieve the above-described two functions, for example, oxygen (O) and nitrogen (N) may be mentioned.

In addition, when an impurity which forms an isolation region imparting optical absorption or reflection properties and an impurity which forms an isolation region imparting electrical isolation properties are both implanted in the organic photoelectric conversion film 44, an isolation region 45 performing optical and electrical isolation can also be formed.

In addition, the isolation region 45 may be formed by breaking bonds, such as molecular bonds, of an organic photoelectric conversion material in the organic photoelectric conversion film 44. For example, when helium (He), argon (Ar), nitrogen (N), oxygen (O), or the like is ion-implanted at a high dose in the organic photoelectric conversion film 44, damage is done to bonds between molecules and/or atoms (for example, molecular bonds are broken thereby). As a result, the isolation region 45 is formed. The high dose is a dose, for example, at which the molecular bonds in the organic photoelectric conversion film 44 are broken, and although depending on the type of organic photoelectric conversion film 44, ion implantation is performed, for example, at a dose of $1\times10^{14}$ $cm^{-2}$ or more.

In addition, in the isolation region 45 formed by ion-implantation of an impurity in the organic photoelectric conversion film 44, some impurity thus implanted may show the above optical and/or insulating properties, and some impurity may form a compound showing the above properties in the organic photoelectric conversion film 44.

In addition, although the isolation region 45 is formed to coincide with the electrode isolation region 42, as for the relative relationship between the width of the isolation region 45 and the width of the electrode isolation region 42, the widths thereof may not be necessarily equal to each other, and the position of the isolation region 45 may not necessarily coincide with that of the electrode isolation region 42. For example, in order not to do damage to the first electrode 41 by implanted ions and/or in order not to mix a secondary sputtered material from the first electrode 41 into the organic photoelectric conversion film 44, the position of the implanted region is preferably made to coincide with that of the electrode isolation region 42, and the width of the implanted region is preferably formed smaller than that of the electrode isolation region 42.

In addition, the effect of the difference in size between the electrode isolation region 42 and the isolation region 45 is the same as described in the first example of the solid-state image pickup device 1.

Figure 6A:
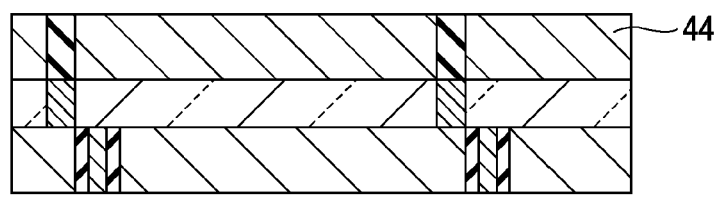
FIGS. 6A and 6B are manufacturing process cross-sectional views showing the first example of the method for manufacturing a solid-state image pickup device.

Next, the resist film 91 is removed, and as shown in FIG. 6A, the surface of the organic photoelectric conversion film 44 is exposed.

Figure 6B:
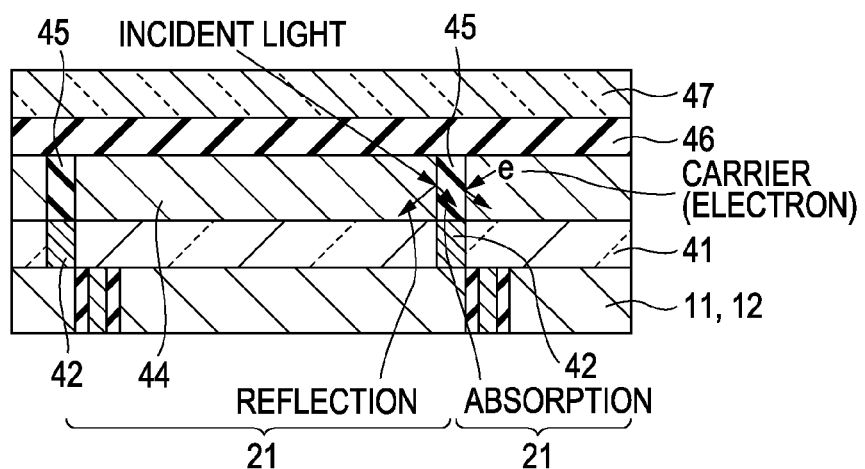

Next, as shown in FIG. 6B, on the organic photoelectric conversion film 44, a second electrode 47 is formed with an insulating blocking film 46 interposed therebetween.

For the blocking film 46, for example, any material may be used as long as it is transparent in a desired wavelength region of the organic photoelectric conversion film 44 and has ionization potential (IP) different from that of the second electrode 47 and the organic photoelectric conversion film 44. For example, for an organic photoelectric conversion film composed of quinacridone, aluminum quinoline (Alq3) or the like is effectively used. This blocking film 46 is relatively selected in consideration of the work function of the organic photoelectric conversion film 44 and that of the second electrode 47 and is not simply determined by one primary characteristic. For example, an organic SOG or a low dielectric constant film of a polyaryl ether, a polyimide, a fluorinated silicon oxide, a silicon carbide, or the like may be used to form the blocking film 46. In addition, a transparent electrode material forming the second electrode 47 or an organic photoelectric conversion material forming the organic photoelectric conversion film 44 may also be used when conditions are satisfied.

In addition, depending on the difference in ionization potential between the first electrode 41 and the organic photoelectric conversion film 44, a blocking film (not shown) similar to the blocking film 46 described above may be necessary between the first electrodes 41 and the organic photoelectric conversion film 44 in some cases.

For the second electrode 47, a transparent electrode material is used. For example, there may be used indium oxide-based ITO (Sn is added as a dopant to $In_2O_3$), $SnO_2$ (added with a dopant) as a tin oxide-based material, an aluminum zinc oxide (Al is added as a dopant to ZnO, such as AZO) as a zinc oxide-based material, a gallium zinc oxide (Ga is added as a dopant to ZnO, such as GZO), an indium zinc oxide (In is added as a dopant to ZnO, such as IZO), CuI, $InSbO_4$, $ZnMgO$, $CuInO_2$, $MgIn_2O_4$, CdO, and $ZnSnO_3$.

Although not shown in the figure, a condenser lens (on-chip lens) 51 condensing incident light on each of the photoelectric conversion portions 22 is formed on the second electrode 47.

When the condenser lenses 51 are formed, for example, an antireflection layer (not shown) may be formed on the surfaces of the condenser lenses 51. In addition, an antireflection layer (not shown) may be formed between the condenser lenses 51 and the organic photoelectric conversion film 44.

As described above, the solid-state image pickup device 1 is formed.

In the method for manufacturing the solid-state image pickup device 1, a manufacturing method in which a green signal is extracted from the organic photoelectric conversion film 44, and blue and red signals are extracted by the bulk spectroscopy is shown; however, another combination may also be used. Furthermore, besides the three primary colors, combination among intermediate colors or arrangement of four colors or more may also be used. In addition, although the case in which the solid-state image pickup device 1 is applied to a whole-area-open-type CMOS image sensor is shown by way of example, of course, it may also be applied to a common CMOS image sensor. In addition, the spectroscopy in the photoelectric conversion portion 22 may also be performed using an organic color filter layer (not shown). In this case, the organic color filter layer may be provided under the organic photoelectric conversion film 44 with an optical transparent insulating film interposed therebetween or may be provided on the organic photoelectric conversion film 44 with an insulating film interposed therebetween.

In addition, in the solid-state image pickup device 1, in order to reduce a dark current and white output pixel defects, a film lowering an interface state and a film having a negative fixed charge (not shown) may be sequentially formed on the surface of the photoelectric conversion portion 22 so as to form a hole accumulation layer at a light receiving surface side of the photoelectric conversion portion 22.

The film lowering an interface state is formed, for example, of a silicon oxide ($SiO_2$) film.

In addition, since the film having a negative fixed charge is formed on the film lowering an interface state, the hole accumulation layer (not shown) is formed at the light receiving surface side of the photoelectric conversion portion 22.

Hence, the film lowering an interface state is formed at least on the photoelectric conversion portion 22 to have a thickness so that the hole accumulation layer can be formed at the light receiving surface side of the photoelectric conversion portion 22 by the film having a negative fixed charge. The thickness is set, for example, to 1 atomic layer to 100 nm.

The film having a negative fixed charge is formed, for example, from a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. Since the films mentioned above have been actually used, for example, as a gate insulating film of an insulating gate type field effect transistor, film forming methods for the above films are already established, and hence the above films can be easily formed.

As the film forming methods, for example, a chemical vapor deposition method, a sputtering method, and an atomic layer deposition method may be mentioned; however, an atomic layer deposition method is preferably used since a $SiO_2$ layer lowering an interface state can be simultaneously formed to have a thickness of approximately 1 nm during the film formation.

In addition, besides the materials mentioned above, lanthanum oxide ($La_2O_3$), praseodymium oxide ($Pr_2O_3$), celium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$) may also be mentioned.

Furthermore, the film having a negative fixed charge may also be formed from a hafnium nitride film, an aluminum nitride film, a hafnium oxynitride film, or an aluminum oxynitride film.

The film having a negative fixed charge may contain silicon (Si) and/or nitrogen (N) as long as the insulating properties are not degraded. The concentration thereof is appropriately determined in the range in which the insulating properties of the film are not degraded. However, in order not to generate image defects, such as white spots, additives such as the silicon and/or nitrogen are preferably added to the surface of the film having a negative fixed charge, that is, to a surface opposite to the active layer 12 side.

As described above, by addition of silicon (Si) and/or nitrogen (N), heat resistance of the film and capability of preventing ion implantation in the process can be improved.

In addition, as a method for forming the films described above, for example, a sputtering method, an atomic layer deposition (ALD) method, a chemical vapor deposition (CVD) method, or a molecular beam epitaxy (MBE) method may be used.

In the method for manufacturing a solid-state image pickup device (first example), since the isolation region 45 performing optical and electrical isolation is formed in the organic photoelectric conversion film 44 at the position corresponding to between the pixels 21, light incident on one pixel is prevented from directly leaking in an adjacent pixel thereto. In addition, carriers (such as electrons e) generated by photoelectrical conversion of light incident on one pixel is prevented from leaking in an adjacent pixel thereto. That is, the isolation region 45 has an optical isolation (absorption or reflection) function as well as electrical insulating properties.

Since the electrode isolation region 42 and the isolation region 45 are formed to be connected to each other, leakage between the electrode isolation region 42 and the isolation region 45 is prevented, and hence the effect described above can be further enhanced.

Accordingly, the spatial resolution capability can be enhanced, and the color mixture can be suppressed, so that a high quality image can be obtained with high accuracy.

In addition, since being formed from an impurity region, the isolation region 45 can be formed, for example, by local ion implantation, and hence, unlike a related technique, etching damage to the organic photoelectric conversion film 44 is not generated. In addition, the degree of machining difficulty for forming the isolation region 45 can be reduced.

[Second Example of Method for Manufacturing Solid-State Image Pickup Device]

Next, a second example of the method for manufacturing a solid-state image pickup device according to the second embodiment of the present invention will be described with reference to manufacturing process cross-sectional views shown in FIGS. 7A to 7D. This manufacturing method is one example of a method for manufacturing the above-described solid-state image pickup device 2. In addition, constituent elements are designated by the same reference numerals as those of the solid-state image pickup device 2 described with reference to FIGS. 2A and 2B.

First, although not shown in the figure, by a common manufacturing method, a plurality of pixels 21 having, for example, photoelectric conversion portions (such as photodiodes) 22 converting incident light into electrical signals and transistor groups 23 (some of them are shown in the figure) each including a transfer transistor, an amplifier transistor, a reset transistor, and the like is formed in an active layer 12 (see FIG. 7A) formed of a semiconductor substrate 11. For the semiconductor substrate 11, for example, a silicon substrate is used. Furthermore, a signal processing portion (not shown) processing a signal charge read out from each of the photoelectric conversion portions 22 is also formed.

Along a part of the periphery of each pixel 21, for example, in a row or a line direction between adjacent pixels 21, an element isolation region 24 is formed.

In addition, a wire layer 31 is formed at a front surface side (a lower side of the semiconductor substrate 11 in the figure) of the semiconductor substrate 11 in which the photoelectric conversion portions 22 are formed. This wire layer 31 includes wires 32 and an insulating film 33 covering the wires 32. A support substrate 35 is formed on the wire layer 31. This support substrate 35 is formed, for example, of a silicon substrate.

Furthermore, an insulating film (not shown) having an optical transparency is formed at a rear surface side of the semiconductor substrate 11. In addition, on this insulating film (an upper surface side in the figure), first electrodes 41 are formed.

For the first electrode 41, a transparent electrode material is used. For example, there may be used indium oxide-based ITO (Sn is added as a dopant to $In_2O_3$), $SnO_2$ (added with a dopant) as a tin oxide-based material, an aluminum zinc oxide (Al is added as a dopant to ZnO, such as AZO) as a zinc oxide-based material, a gallium zinc oxide (Ga is added as a dopant to ZnO, such as GZO), an indium zinc oxide (In is added as a dopant to ZnO, such as IZO), CuI, $InSbO_4$, ZnMgO, $CuInO_2$, $MgIn_2O_4$, CdO, and $ZnSnO_3$.

In addition, an electrode isolation region 42 is formed between the first electrodes 41 so as to correspond to between the pixels 21. That is, the first electrodes 41 are separated to correspond to the respective pixels.

Figure 7A:
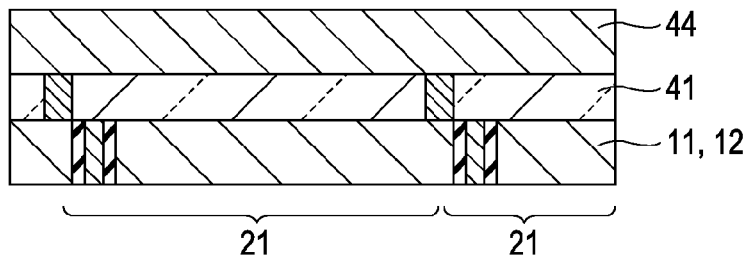
FIGS. 7A to 7D are manufacturing process cross-sectional views showing a second example of the method for manufacturing a solid-state image pickup device.

Next, as shown in FIG. 7A, an organic photoelectric conversion film 44 is formed on the first electrodes 41 with an insulating film (not shown) having a planarized surface interposed therebetween. The organic photoelectric conversion film 44 is formed, for example, to have a thickness of 100 nm. This thickness may be optionally selected.

The organic photoelectric conversion film 44 is formed of a photosensitive material, such as a photosensitive organic photoelectric conversion material. The sensitivity thereof may be either a positive type or a negative type.

As the photosensitive organic photoelectric conversion material, a photosensitive material may be mixed with the aforementioned organic photoelectric conversion material, or a photosensitive functional group may be imparted to an organic photoelectric conversion material itself. As the photosensitive material or the photosensitive functional group, for example, an azido compound-based, a diazonaphtoquinone novolac-based, a chemical amplification-based, and an optical amplification-based material or group, each of which is generally known in a lithographic technique field, may be mentioned and may be selected in consideration of matching with an organic photoelectric conversion material.

As the organic photoelectric conversion material, for example, polymers of phenylene vinylene, fluorene, carbazole, indole, pyrene, pyrrole, pycoline, thiophene, acetylene and diacetylene or derivatives thereof may be used.

Furthermore, for example, there can be preferably used metal complex dyes, cyanine-based dyes, merocyanine-based dyes, phenylxanthene-based dyes, triphenylmethane-based dyes, rhodacyanine-based dyes, xanthene-based dyes, macrocyclic aza-annulene-based dyes, azulene-based dyes, naphtoquinone-based dyes, anthraquinone-based dyes, chain compounds obtained by condensation between condensed polycyclic aromatic compounds, such as anthracene and pyrene, and aromatic or hetero ring compounds, two nitrogen-containing heterocyclic rings, such as quinoline, benzothiazole, and benzooxazole, bonded through a squarylium group and/or a croconic methine group, and cyanine analogue dyes bonded by a squarylium group and/or a croconic methine group.

In addition, as the metal complex dyes, dithiol metal complex dyes, metal phthalocyanine dyes, metal porphyrin dyes or ruthenium complex dyes are preferable, and the ruthenium complex dyes are particularly preferable; however, the metal complex dyes are not limited to those mentioned above.

Figure 7B:
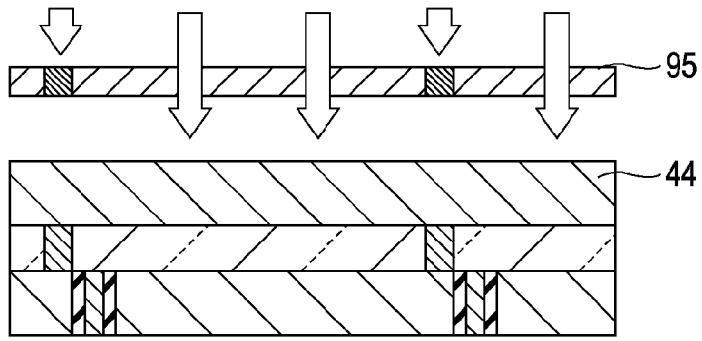

Next, as shown in FIG. 7B, by a lithographic technique, such as exposure and development, using a mask 95, the organic photoelectric conversion film 44 is exposed. For example, in the example shown in the figure, an organic photoelectric conversion film 44 composed of a negative type photosensitive organic photoelectric conversion material is used, and regions other than that in which the isolation region is formed are exposed. In this case, the non-exposed region corresponds to an isolation groove to be formed in the organic photoelectric conversion film 44 between the pixels.

Figure 7C:
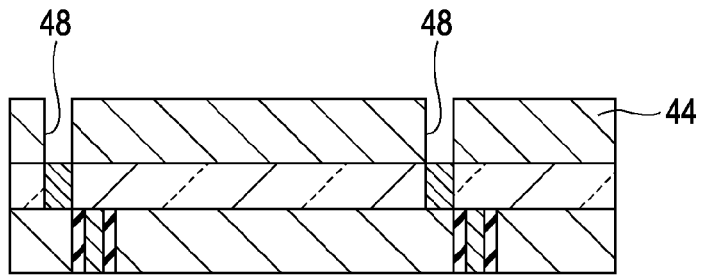

Next, as shown in FIG. 7C, the organic photoelectric conversion film 44 is developed, and whenever necessary, for example, a baking treatment is performed, so that an isolation groove 48 is formed in the organic photoelectric conversion film 44 between the pixels.

Since the organic photoelectric conversion film 44 has photosensitivity, unlike a related technique, while any etching damage is not done to the organic photoelectric conversion film 44 by exposure and development processes, the isolation groove 48 can be formed in the organic photoelectric conversion film 44. Incidentally, whenever necessary, before and/or after the exposure and/or the development, an appropriate baking treatment is performed.

Figure 7D:
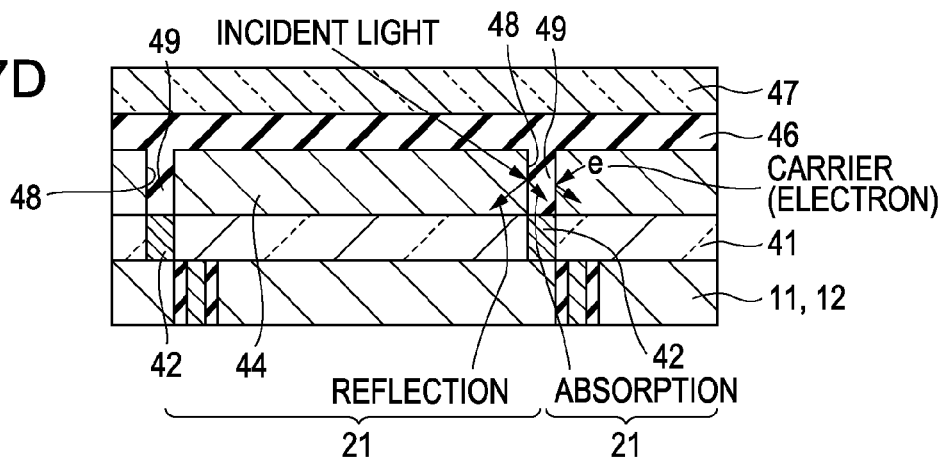

Next, as shown in FIG. 7D, a blocking film 46 is formed on the organic photoelectric conversion film 44 so as to fill the isolation groove 48. A part of the blocking film 46 filled in the isolation groove 48 forms an isolation region 49. For this blocking film 46, any material may be used as long as it is transparent in a desired wavelength region of the organic photoelectric conversion film 44 and has ionization potential (IP) different from that of the organic photoelectric conversion film 44 and a second electrode 47 which is next formed. For example, for an organic photoelectric conversion film 44 composed of quinacridone, aluminum quinoline (Alq3) or the like is effectively used. This blocking film 46 is relatively selected in consideration of the work function of the organic photoelectric conversion film 44 and that of the second electrode 47 and is not simply determined by one primary characteristic. For example, an organic SOG or a low dielectric constant film of a polyaryl ether, a polyimide, a fluorinated silicon oxide, a silicon carbide, or the like may be used to form the blocking film 46. In addition, a transparent electrode material for the second electrode 47 which is next formed or an organic photoelectric conversion material forming the organic photoelectric conversion film 44 may also be used when conditions are satisfied.

In addition, as a material forming the isolation region 49, any material may be used as long as it has an electrical isolation function (insulating properties) and an optical isolation (absorption or reflection) function.

For example, the isolation region 49 may be formed using a material different from that for the blocking film 46. For example, by a carbon black resist having photosensitivity, the isolation region 49 can be formed. The isolation region 49 formed of a carbon black resist has insulating properties and also an optical isolation function by optical absorption of contained carbon.

Although not being shown in the figure, for example, when the isolation region 49 is formed using the carbon black resist having photosensitivity, a carbon black resist film having photosensitivity is formed on the organic photoelectric conversion film 44, for example, by a coating method so as to fill the isolation groove 48.

Subsequently, an excess carbon black resist having photosensitivity on the organic photoelectric conversion film 44 is removed so that this carbon black resist is allowed to remain only inside the isolation groove 48, thereby forming the isolation region 49. Since this isolation region 49 is able to absorb light by carbon of the carbon black resist having photosensitivity, an optical isolation function can be obtained. In addition, since insulating properties are imparted by carbon, the isolation region 49 has an insulating function.

In addition, although the isolation region 49 is formed to coincide with the electrode isolation region 42, as for the relative relationship between the width of the isolation region 49 and the width of the electrode isolation region 42, the widths thereof may not be necessarily equal to each other, and the position of the isolation region 49 may not necessarily coincide with that of the electrode isolation region 42. The effect of the difference in size between the electrode isolation region 42 and the isolation region 49 is the same as described above.

Since the organic photoelectric conversion film 44 has photosensitivity, after the organic photoelectric conversion film 44 is formed, when exposure and development processes are performed thereon, the isolation groove 48 can be formed therein. Accordingly, unlike a related technique, etching damage is not done to the organic photoelectric conversion film 44. Incidentally, whenever necessary, before and/or after the exposure and/or development, an appropriate baking treatment is performed.

In addition, the isolation region 49 may also be formed in the blocking film 46 provided on the organic photoelectric conversion film 44 to correspond to between the pixels by using a material different from that for the blocking film 46. In this case, the formation of the isolation groove 48 is performed after the blocking film 46 is formed, and the isolation region 49 may be formed so as to fill the isolation groove 48. In addition, also in this case, the blocking film 46 and the organic photoelectric conversion film 44 are each formed from a material having photosensitivity, and the isolation groove 48 is formed by exposure and development.

Next, the second electrode 47 is formed on the blocking film 46.

For the second electrode 47, a transparent electrode material is used. For example, there may be used indium oxide-based ITO (Sn is added as a dopant to $In_2O_3$), $SnO_2$ (added with a dopant) as a tin oxide-based material, an aluminum zinc oxide (Al is added as a dopant to ZnO, such as AZO) as a zinc oxide-based material, a gallium zinc oxide (Ga is added as a dopant to ZnO, such as GZO), an indium zinc oxide (In is added as a dopant to ZnO, such as IZO), CuI, $InSbO_4$, ZnMgO, $CuInO_2$, $MgIn_2O_4$, CdO, and $ZnSnO_3$.

Although not shown in the figure, a condenser lens (on-chip lens) 51 condensing incident light on each of the photoelectric conversion portions 22 is formed on the second electrode 47.

When the condenser lenses 51 are formed, for example, an antireflection layer (not shown) may be formed on the surfaces of the condenser lenses 51. In addition, an antireflection layer (not shown) may be formed between the condenser lenses 51 and the organic photoelectric conversion film 44.

As described above, the solid-state image pickup device 2 is formed.

In the method for manufacturing a solid-state image pickup device (second example), a manufacturing method in which a green signal is extracted from the organic photoelectric conversion film 44, and blue and red signals are extracted by the bulk spectroscopy is shown; however, another combination may also be used. Furthermore, besides the three primary colors, combination among intermediate colors or arrangement of four colors or more may also be used. In addition, although the case in which the solid-state image pickup device 2 is applied to a whole-area-open-type CMOS image sensor is shown by way of example, of course, it may also be applied to a common CMOS image sensor. In addition, the spectroscopy in the photoelectric conversion portion 22 may also be performed using an organic color filter layer (not shown). In this case, the organic color filter layer may be provided under the organic photoelectric conversion film 44 with an optical transparent insulating film interposed therebetween or may be provided on the organic photoelectric conversion film 44 with an insulating film interposed therebetween.

In addition, in the solid-state image pickup device 2, as in the case of the first example of the manufacturing method, in order to reduce a dark current and white output pixel defects, a film lowering an interface state and a film having a negative fixed charge (not shown) may be sequentially formed on the surface of the photoelectric conversion portion 22. When the film lowering an interface state and the film having a negative fixed charge are formed on the surface of the photoelectric conversion portion 22 as described above, a hole accumulation layer is formed at a light receiving surface side of the photoelectric conversion portion 22.

In the method for manufacturing a solid-state image pickup device (second example), since the isolation region 49 performing optical and electrical isolation is formed in the organic photoelectric conversion film 44 at the position corresponding to between the pixels 21, light incident on one pixel is prevented from directly leaking in an adjacent pixel thereto. In addition, carriers generated by photoelectrical conversion of light incident on one pixel are prevented from leaking in an adjacent pixel thereto. That is, the isolation region 49 has an optical isolation (absorption or reflection) function as well as electrical insulating properties.

Since the electrode isolation region 42 and the isolation region 49 are formed to be connected to each other, leakage between the electrode isolation region 42 and the isolation region 49 is prevented, and hence the effect described above can be further enhanced.

Accordingly, the spatial resolution capability can be enhanced, and the color mixture can be suppressed, so that a high quality image can be obtained with high accuracy.

In addition, since the isolation groove 48 is formed using exposure and development processes, unlike a related technique, etching damage to the organic photoelectric conversion film 44 is not generated. In addition, the degree of machining difficulty for forming the isolation region 49 can be reduced.

<3. Third Embodiment>
[Example of Structure of Image Pickup Apparatus]

One example of the structure of an image pickup apparatus according to a third embodiment of the present invention will be described with reference to a block diagram in FIG. 8. This image pickup apparatus uses the solid-state image pickup device according to an embodiment of the present invention.

Figure 8:
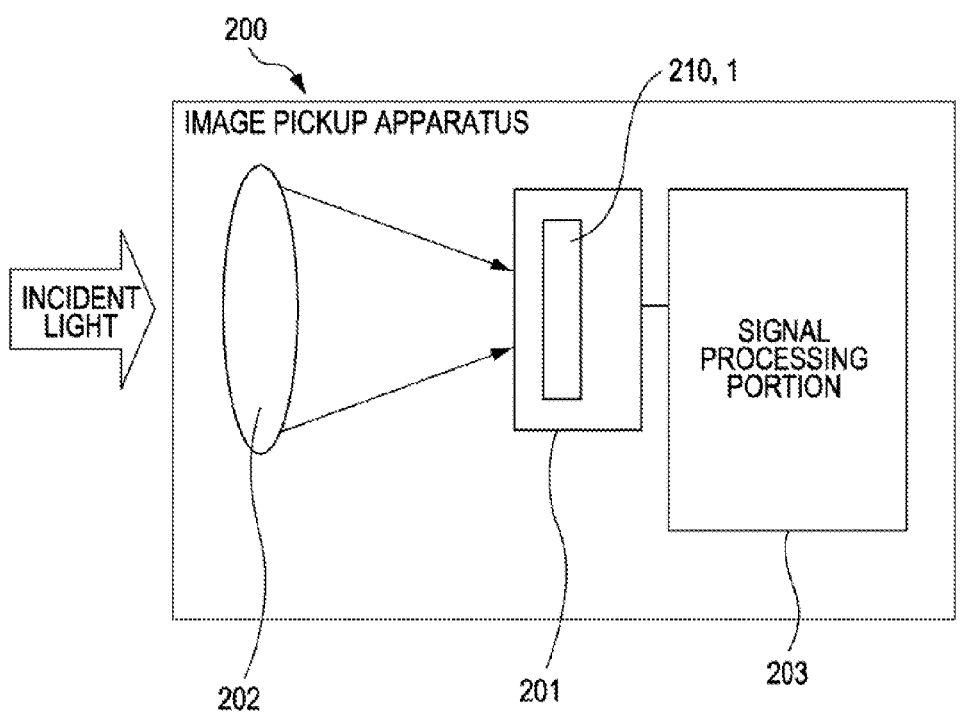
FIG. 8 is a block diagram showing one example of an image pickup apparatus according to a third embodiment of the present invention.
Figure 9:
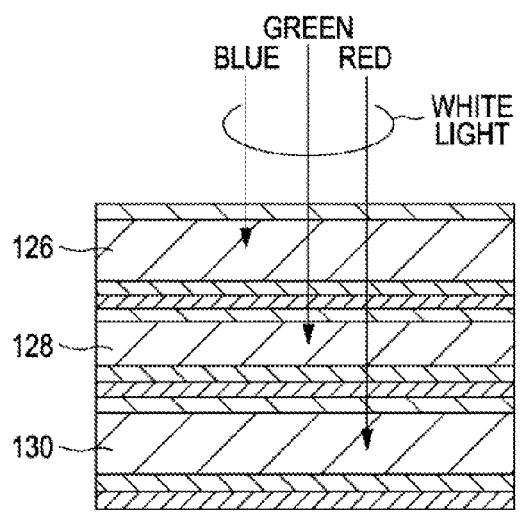
FIG. 9 is a schematic cross-sectional view showing one example of a related technique.
Figure 10A:
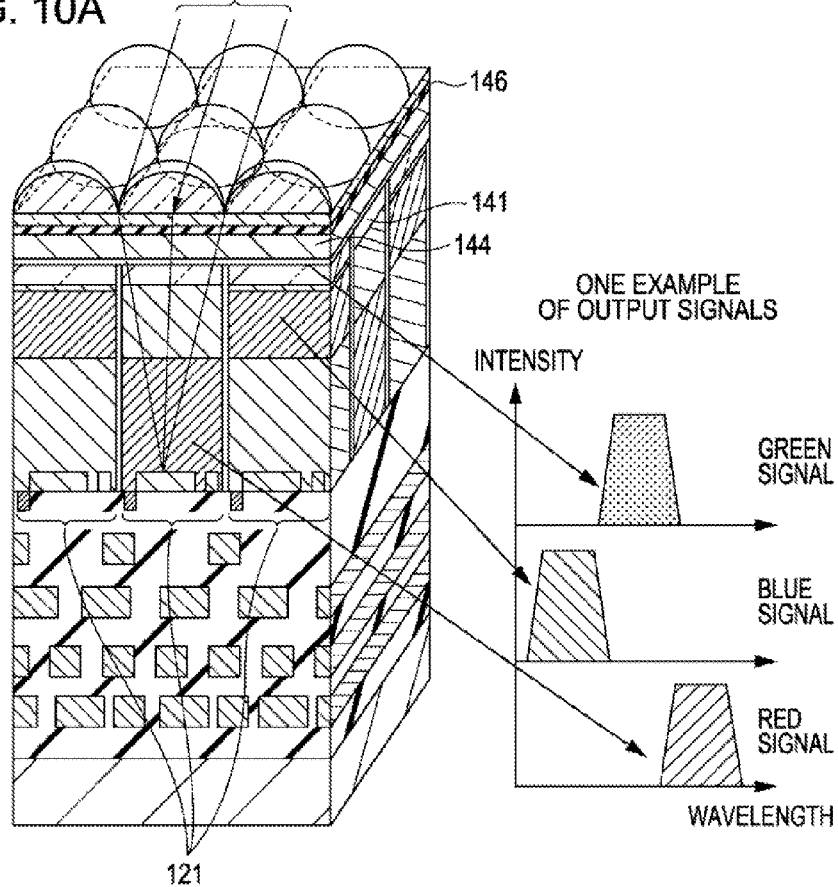
FIG. 10A is a schematic structural perspective cross-sectional view showing one example of a solid-state image pickup device of a related technique.
Figure 10B:
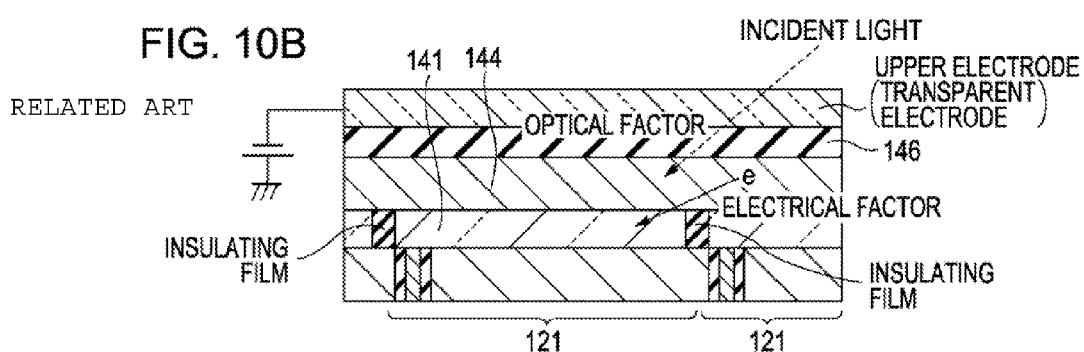
FIG. 10B is a schematic cross-sectional view of the solid-state image pickup device shown in FIG. 10A.
Figure 11A:
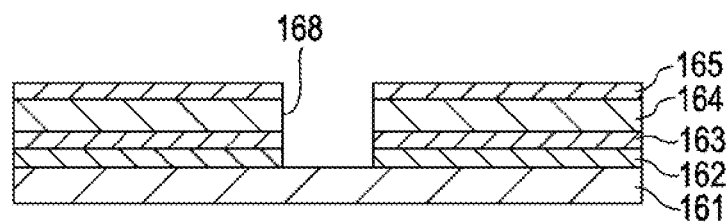
FIGS. 11A and 11B are each a schematic cross-sectional view showing one example of a related technique.
Figure 11B:
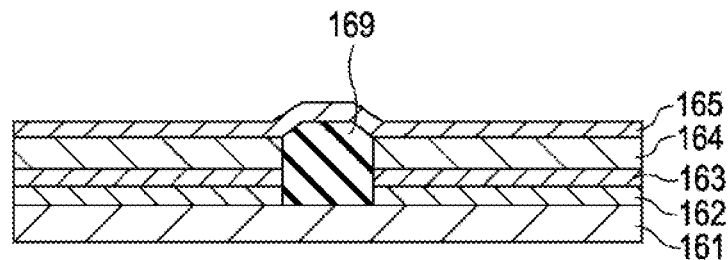

As shown in FIG. 8, an image pickup apparatus 200 includes a solid-state image pickup device 210 in an image pickup portion 201. A light condensing optical portion 202 forming an image is provided at a light condensing side of this image pickup portion 201, and a signal processing portion 203 having, for example, a signal processing circuit which processes signals photoelectric-converted in the solid-state image pickup device 210 into an image is connected to the image pickup portion 201. In addition, an image signal processed by the signal processing portion 203 may be stored in an image storage portion (not shown). In the image pickup apparatus 200 described above, one of the solid-state image pickup devices 1 and 2 described in the above embodiments may be used as the solid-state image pickup device 210.

In the image pickup apparatus 200, since one of the solid-state image pickup devices 1 and 2 according to the above embodiments of the present invention is used, the spatial resolution capability can be enhanced and the color mixture can be suppressed as described above, so that a high quality image can be obtained with high accuracy. Accordingly, the image quality can be improved.

In addition, the present invention is not limited to the image pickup apparatus 200 having the structure described above but may also be applied to various image pickup apparatuses each including a solid-state image pickup device.

For example, the image pickup apparatus 200 described above may have a one-chip structure or may have a module structure in which an image pickup portion and a signal processing portion or an optical system are collectively formed to provide an image pickup function.

The "image pickup apparatus" in this embodiment indicates, for example, a camera or a mobile apparatus having an image pickup function. In addition, the concept of the "image pickup" includes, for example, fingerprint detection in a broad sense as well as a common image pickup using a camera.

The present application contains subject matter related to that disclosed in Japanese Priority Patent Application JP 2009-185533 filed in the Japan Patent Office on Aug. 10, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
a plurality of pixels provided in a semiconductor substrate, the pixels including a plurality of photoelectric conversion portions and MOS transistors which selectively read out signals therefrom;
at least one organic photoelectric conversion film on the photoelectric conversion portions; and
an isolation region provided in the organic photoelectric conversion film at a position corresponding to between the pixels to divide the organic photoelectric conversion film between the pixels to perform optical and electrical isolation, the isolation region being a portion of the organic photoelectric conversion film with a characteristic not present in a remainder of the organic photoelectric conversion film, wherein the isolation region extends to the top and the bottom of the organic photoelectric conversion film to divide the photoelectric conversion film into separate areas.

2. The solid-state image pickup device according to claim 1, wherein the isolation region comprises an impurity region provided in the organic photoelectric conversion film.

3. The solid-state image pickup device according to claim 1, wherein the isolation region comprises a region in which molecular bonds in the organic photoelectric conversion film are broken.

4. The solid-state image pickup device according to claim 1, wherein the isolation region comprises a photosensitive material.

5. The solid-state image pickup device according to claim 1, wherein the organic photoelectric conversion film comprises an organic photoelectric conversion material having photosensitivity.

6. The solid-state image pickup device according to claim 5, wherein the organic photoelectric conversion material having photosensitivity comprises an organic photoelectric conversion material and a photosensitive material.

7. The solid-state image pickup device according to claim 5, wherein the organic photoelectric conversion material having photosensitivity comprises an organic photoelectric conversion material having a photosensitive reactive group.

8. The solid-state image pickup device according to claim 1, further comprising a blocking film provided on the organic photoelectric conversion film, wherein the isolation region is also provided in the blocking film at a position corresponding to between the pixels.

9. An image pickup apparatus comprising:
a light condensing optical portion condensing incident light;
an image pickup portion having a solid-state image pickup device which receives light condensed by the light condensing optical portion and performs photoelectrical conversion of the light; and
a signal processing portion processing a signal which is photoelectrical-converted by the solid-state image pickup device and is output from the image pickup portion, wherein the solid-state image pickup device includes
a plurality of pixels provided in a semiconductor substrate, the pixels including a plurality of photoelectric conversion portions and MOS transistors selectively reading out signals therefrom;
at least one organic photoelectric conversion film on the photoelectric conversion portions; and
an isolation region provided in the organic photoelectric conversion film at a position corresponding to between the pixels to divide the organic photoelectric conversion film between the pixels to perform optical and electrical isolation, the isolation region being a portion of the organic photoelectric conversion film with a characteristic not present in a remainder of the organic photoelectric conversion film, wherein the isolation region extends to the top and the bottom of the organic photoelectric conversion film to divide the photoelectric conversion film into separate areas.

10. The solid-state image pickup device according to claim 1, wherein the characteristic is related to at least one of an optical isolation function or an electrical isolation function.

11. The solid-state image pickup device according to claim 1, wherein the isolation region is formed by a method comprising local ion implantation.

12. The solid-state image pickup device according to claim 1, wherein the isolation region is formed by a method comprising an exposure and development process.

13. The image pickup apparatus according to claim 9, wherein the characteristic is related to at least one of an optical isolation function or an electrical isolation function.

14. The image pickup apparatus according to claim 9, wherein the isolation region is formed by a method comprising local ion implantation.

15. The image pickup apparatus according to claim 9, wherein the isolation region is formed by a method comprising an exposure and development process.

* * * * *